US011940907B2

(12) United States Patent
Grymel et al.

(10) Patent No.: US 11,940,907 B2
(45) Date of Patent: Mar. 26, 2024

(54) METHODS AND APPARATUS FOR SPARSE TENSOR STORAGE FOR NEURAL NETWORK ACCELERATORS

(71) Applicant: Intel Corporation, Santa Clara, CA (US)

(72) Inventors: Martin-Thomas Grymel, Leixlip (IE); David Bernard, Kilcullen (IE); Niall Hanrahan, Corrandulla (IE); Martin Power, Dublin (IE); Kevin Brady, Newry (GB); Gary Baugh, Bray (IE); Cormac Brick, San Francisco, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/359,217

(22) Filed: Jun. 25, 2021

(65) Prior Publication Data

US 2021/0406164 A1 Dec. 30, 2021

(51) Int. Cl.
*G06F 12/00* (2006.01)
*G06F 12/02* (2006.01)
*G06N 3/10* (2006.01)

(52) U.S. Cl.
CPC ...... *G06F 12/0207* (2013.01); *G06F 12/0292* (2013.01); *G06N 3/10* (2013.01)

(58) Field of Classification Search
CPC ........ G06F 3/06; G06F 11/1446; G06F 12/00; G06F 13/16
See application file for complete search history.

(56) References Cited

U.S. PATENT DOCUMENTS

| 11,321,092 B1* | 5/2022 | Raikin | G06F 9/30196 |
| 2012/0144130 A1* | 6/2012 | Fossum | G06F 17/16 |
| | | | 711/E12.001 |
| 2019/0042257 A1* | 2/2019 | Baum | G06F 9/3013 |

(Continued)

FOREIGN PATENT DOCUMENTS

EP 3726733 A1 10/2020

OTHER PUBLICATIONS

Abts. et al."Think Fast: A Tensor Streaming Processor (TSP) for Accelerating Deep Learning Workloads", 2020 pp. 145-158 (Year: 2020).*

(Continued)

*Primary Examiner* — Arvind Talukdar
(74) *Attorney, Agent, or Firm* — Akona IP PC

(57) ABSTRACT

Methods, apparatus, systems and articles of manufacture are disclosed for sparse tensor storage for neural network accelerators. An example apparatus includes sparsity map generating circuitry to generate a sparsity map corresponding to a tensor, the sparsity map to indicate whether a data point of the tensor is zero, static storage controlling circuitry to divide the tensor into one or more storage elements, and a compressor to perform a first compression of the one or more storage elements to generate one or more compressed storage elements, the first compression to remove zero points of the one or more storage elements based on the sparsity map and perform a second compression of the one or more compressed storage elements, the second compression to store the one or more compressed storage elements contiguously in memory.

24 Claims, 27 Drawing Sheets

(56) References Cited

U.S. PATENT DOCUMENTS

| | | | |
|---|---|---|---|
| 2019/0379396 A1 | 12/2019 | Bajic et al. | |
| 2020/0012608 A1* | 1/2020 | Woo | G06N 3/0454 |
| 2020/0327079 A1* | 10/2020 | Zhao | G06K 9/6232 |
| 2020/0336153 A1 | 10/2020 | Ovsiannikov | |
| 2021/0303909 A1* | 9/2021 | Gunnam | G06V 10/82 |
| 2022/0382829 A1* | 12/2022 | Pope | G06F 7/4876 |

OTHER PUBLICATIONS

Aimar et al ('NullHop: A Flexible Convolutional Neural Network Accelerator Based on Sparse Representations of Feature Maps', 2018, pp. 1-13) (Year: 2018).*

European Patent Office, "Extended European Search Report," issued in connection with European Patent Application No. 22164349.7, dated Sep. 15, 2022, 13 pages.

Srivastava et al., "Tensaurus: A Versatile Accelerator for Mixed Sparse-Dense Tensor Computations," 2020 IEEE International Symposium on High Performance Computer Architecture (HPCA), Feb. 22-26, 2020, San Diego, CA, USA, Doi: 10.1109/HPCA47549.2020.00062, 689-702, 14 pages.

Stackoverflow, "How to rotate a Torch Tensor by a random number of degrees," Aug. 27, 2020, retrieved from URL<https://stackoverflow.com/questions/63619435/how-to-rotate-a-torch-tensor-by-a-random-number-of-degrees>, 2 pages.

Tew, Parker, "An Investigation of Sparse Tensor Formats for Tensor Libraries," Master Thesis, Massachusetts Institute of Technology, Sep. 2016, 53 pages.

* cited by examiner

METHODS AND APPARATUS FOR SPARSE TENSOR STORAGE FOR NEURAL NETWORK ACCELERATORS

FIELD OF THE DISCLOSURE

This disclosure relates generally to tensor storage, and, more particularly, to methods and apparatus for sparse tensor storage for neural network accelerators.

BACKGROUND

Neural networks may store data in tensors. A tensor is data structure. For example, a tensor is a multidimensional array (e.g., a vector, a matrix, etc.) to store data. During processing, a tensor can be rotated (e.g., the axes of the tensor are permuted). In neural network accelerators, tensor computations can be broken down into smaller workloads for parallelization.

BRIEF DESCRIPTION OF THE DRAWINGS

The figures are not to scale. In general, the same reference numbers will be used throughout the drawing(s) and accompanying written description to refer to the same or like parts.

Figure 1:
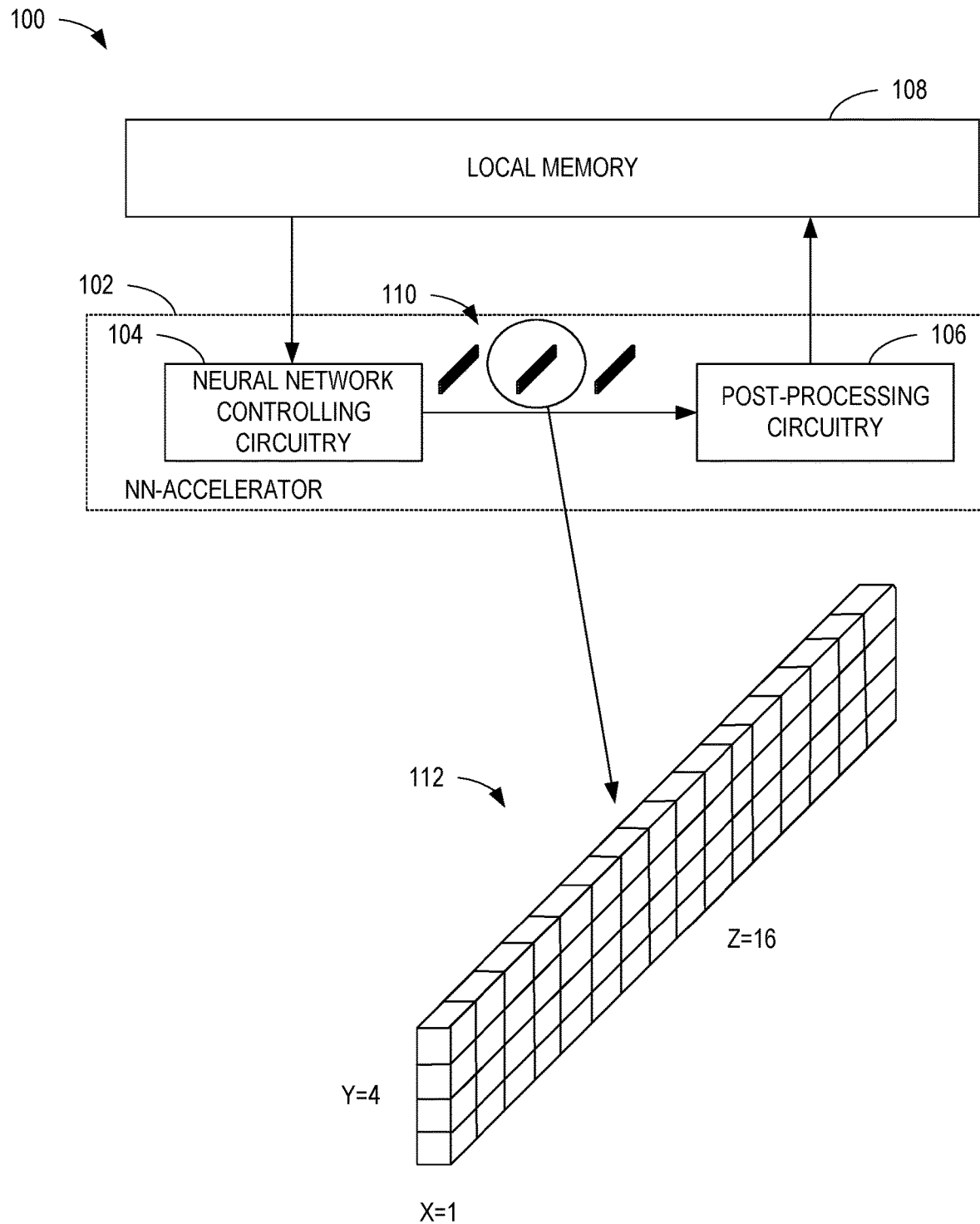
FIG. 1 is a schematic illustration of an example tensor storage system constructed in accordance with teachings of this disclosure for sparse tensor storage.

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein "substantially real time" refers to occurrence in a near instantaneous manner recognizing there may be real world delays for computing time, transmission, etc. Thus, unless otherwise specified, "substantially real time" refers to real time +/−1 second. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events. As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

Neural networks may store data in tensors. As tensors are processed through neural networks, they can acquire a higher degree of sparsity. As used herein, "sparsity" refers to a measure of how many zeros a tensor stores. Sparsity can be leveraged by neural networks to increase the performance of neural network accelerators. In some examples, to take advantage of tensor sparsity, efficient storage of the tensor data is required. That is, the more the tensor data is compacted but still rapidly processed, the more efficient the accelerator becomes. If the tensor data is compressed in memory, the tensor data requires less storage space and less transfers to and from memory, improving the speed and power of neural networks.

The storage of tensors can also depend on the orientation of the tensor. For example, in convolutional neural networks, tensors can be rotated at some stage in the network (e.g., the axes of the tensor are permuted). In some examples, a 3D tensor may be visualized as a 3D array with dimensions along the X axis, the Y axis, and the Z axis. In some examples, the rotation of the tensor is based on how the data is stored with respect to the X axis, the Y axis, and the Z axis. For example, there are six rotations possible for 3D tensors (e.g., XYZ, XZY, YXZ, YZX, ZXY, and ZYX). The storage format resembles one of the axis permutations. For example, if the XY-planes of an image are stored consecutively (e.g., channel-major mode), the image is stored in XYZ format. If a network operation requires a tensor to be rotated, the tensor storage format is switched.

In neural network accelerators, tensor computations can be broken down into smaller workloads for parallel speedup. For example, the output of a first computation can be used as the input to subsequent computations. A tensor operation that involves a compute kernel of a size greater than 1×1 may require the bordering regions of adjacent workloads if the previous computation has been split across a plane (e.g., the XY-plane, etc.). In such examples, it is advantageous to replicate the bordering regions into local memory of the parallel compute units that will require the data in the next step as opposed to parallel compute units making a higher-latency read during compute.

In previous solutions, sparsity is not taken into account in convolutional neural network accelerators. Thus, tensor data is stored in an uncompressed, dense format and occupies more storage space. Fast memory is a scarce resource, and its use can become a bottleneck during processing. Additionally, if tensor data cannot fit in its entirety inside the memory due to its size, the neural network accelerator may be stored in larger, slower memory resources. The larger the memory footprint of the tensor data, the more transactions are needed. This can increase the transfer time and power consumption if the tensor data needs to be stored and/or moved.

Previous solutions rotate tensors with general purpose application processors that read in the tensor in its original format from memory, perform an address translation for each chunk of data, and store it back to memory in the new format. This can be costly with respect to computing time and power to read out data by an application processor, perform the address translation, and store it back to memory. Furthermore, if the application processor is being used to rotate tensor data, the application processor cannot be used at the same time for other tasks. Thus, an additional delay will be required for tensor rotations due to synchronization (e.g., the application processor can only start reading in data to be rotated when the data has been produced and is already stored in memory). The software design may also become more complex if custom processing functions need to be scheduled to perform rotations on the application processor.

In some previous solutions, compute units request border region (e.g., halo) data from other compute units that have produced the data in a preceding step. In some other previous solutions, the compute units broadcast all the data produced to other compute units that may only require a portion of the data. Thus, if the entirety of data, not just the required border regions, is replicated between compute units, more data is being transferred than necessary. This can result in longer delays and a higher power consumption. If data from a previous workload is requested from other compute units, a delay is introduced. For example, data is usually requested sometime after it has been produced due to a required synchronization mechanism. Also, requesting data involves a two-step process with a request and a response if compared to a write-only mechanism. Request interfaces for shared tensor data requires more area due to more complex logic and an increase in inter-engine wiring, thus also increasing power requirements. The software complexity is also increased due to additional management of the border region replication.

Examples disclosed herein leverage sparsity to compress tensor data before transferring and/or storing the tensor in memory. For example, compression streams are divided into contiguous memory chunks that can be accessed at predetermined memory locations and/or via pointers. Example techniques disclosed herein also perform rotation of tensor data in the neural network accelerator. For example, a tensor that is buffered within the neural network accelerator is rotated and subsequently sent to memory. Example techniques disclosed herein further include replicating border region data to other compute units that may require it in the next processing step. That is, only data that is required is transferred.

FIG. 1 is a schematic illustration of an example tensor storage system 100 constructed in accordance with teachings of this disclosure for sparse tensor storage. The example tensor storage system 100 includes an example neural network (NN) accelerator 102, example neural network controlling circuitry 104, example post-processing circuitry 106, and an example local memory 108.

In the illustrated example of FIG. 1, the NN accelerator 102 includes the NN controlling circuitry 104 and the post-processing circuitry 106. The example NN controlling circuitry 104 accesses data stored in the local memory 108 and generates output tensors. In some examples, the NN controlling circuitry 104 implements a convolutional neural network. In examples disclosed herein, the output tensor is three-dimensional. However, the NN controlling circuitry 104 can additionally or alternatively generate tensors with fewer or greater dimensions (e.g., two-dimensional, etc.). An example tensor is described below in connection with FIG. 4.

The example NN controlling circuitry 104 generates an output tensor and transmits the output tensor to the post-processing circuitry 106 in example tile segments 110. The example tile segments 110 include an example tile segment 112. In the illustrated example of FIG. 1, the tile segment 112 has dimensions of 1×4×16 (e.g., X=1, Y=4, Z=16). In some examples, the points of the tile segments 110 are 1, 2, 4, 8, 16, or 32-bit wide. For example, if the points of the tile segments 110 are 1, 2, or 4-bit wide data, the post-processing circuitry 106 can transmit the tensor points to the local memory 108 filling entire bytes. For example, 1 byte stores two tensor points for 4-bit data, 1 byte stores four tensor points for 2-bit data, and 1 byte stores eight tensor points for 1-bit data.

The example post-processing circuitry 106 obtains the tile segments 110. The example post-processing circuitry 106 determines whether to rotate the tile segments 110 of the tensor. In some examples, the post-processing circuitry 106 determines whether to rotate the tile segments 110 based on a configuration register set by a compiler (not illustrated). The example post-processing circuitry 106 compresses the tensor. For example, the post-processing circuitry 106 compresses the tensor to store the tensor in a static format.

Additionally or alternatively, the post-processing circuitry 106 compresses the static format tensor to store the tensor in a dynamic format. The example post-processing circuitry 106 broadcasts the halos of the compressed and/or uncompressed tensor. For example, the post-processing circuitry 106 determines data points of the tensor to replicate to other compute units. The example post-processing circuitry 106 stores the compressed and/or uncompressed tensor in the example local memory 108. An example implementation of the post-processing circuitry 106 is described below in connection with FIG. 3.

The example local memory 108 stores tensor data. For example, the local memory 108 stores the compressed tensors generated by the post-processing circuitry 106. In some examples, the local memory 108 is fast memory. The local memory 108 can be volatile memory implemented by Synchronous Dynamic Random Access Memory (SDRAM), Dynamic Random Access Memory (DRAM), RAMBUS® Dynamic Random Access Memory (RDRAM®) and/or any other type of random access memory device. Additionally or alternatively, the local memory 108 can be non-volatile memory implemented by flash memory and/or any other desired type of memory device.

Figure 2:
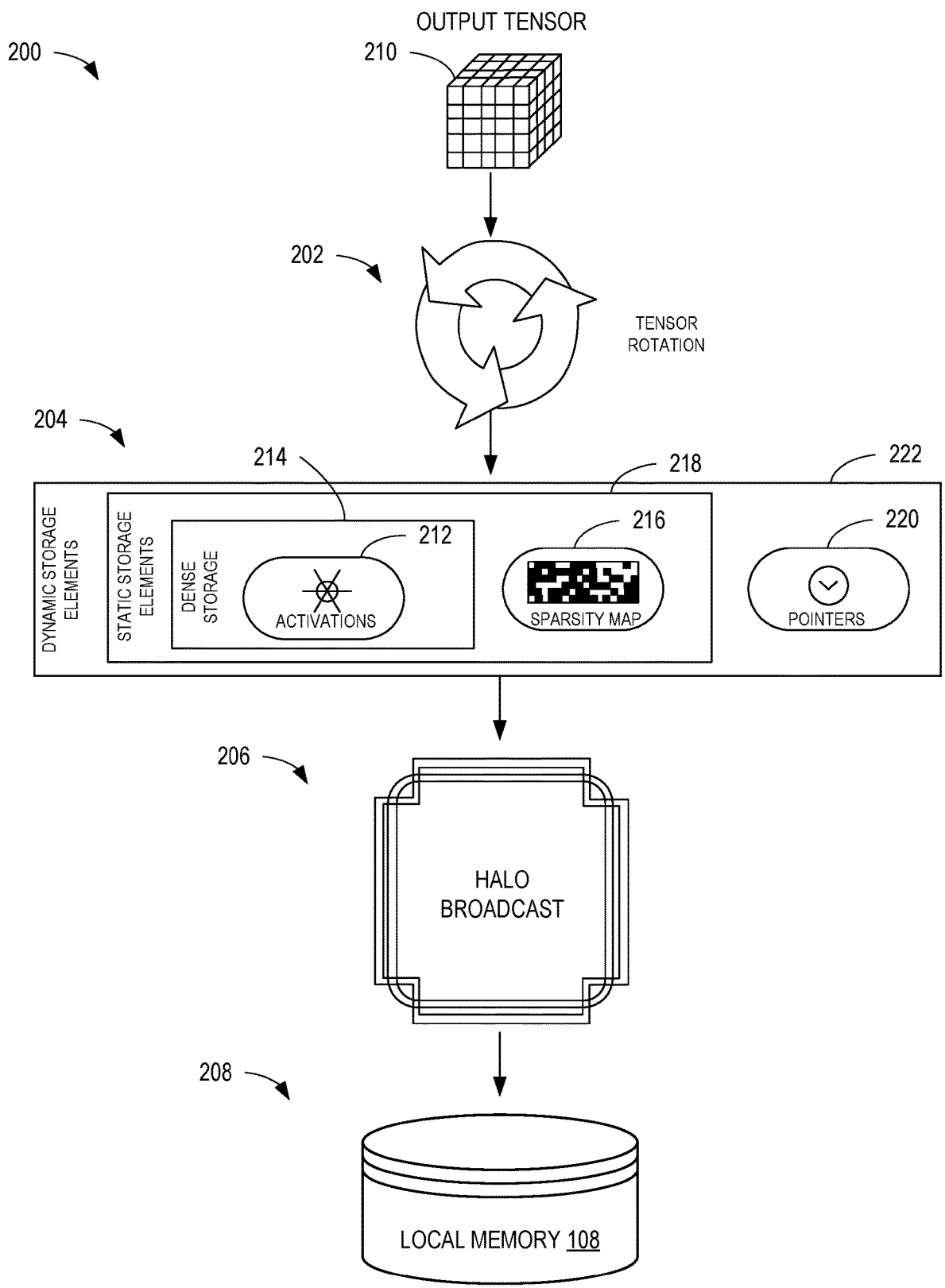
FIG. 2 is an example tensor storage architecture constructed in accordance with teachings of this disclosure.

FIG. 2 is an example tensor storage architecture 200 constructed in accordance with teachings of this disclosure. In the illustrated example of FIG. 2, the tensor storage architecture 200 includes an example tensor rotation stage 202, an example compression stage 204, an example halo broadcast stage 206, and an example storage stage 208. The example tensor storage architecture 200 includes an example output tensor 210. For example, the NN controlling circuitry 104 (FIG. 1) generates the output tensor 210.

During the example tensor rotation stage 202, the example post-processing circuitry 106 (FIG. 1) rotates the output tensor 210. For example, the post-processing circuitry 106 determines the orientation of the output tensor 210 and a target orientation. The example post-processing circuitry 106 performs a permutation of the axes of the output tensor 210 to generate a rotated tensor. In some examples, the post-processing circuitry 106 determines to not rotate the output tensor 210.

During the example compression stage 204, the post-processing circuitry 106 compresses the output tensor 210 (e.g., the rotated tensor). The example post-processing circuitry 106 generates certain output elements depending on what kind of storage format is selected. For example, the post-processing circuitry 106 generates example output activation transactions 212, which culminate in an example dense storage 214. As used herein, "output activations" refer to the data points of the output tensor (e.g., the output tensor 210). That is, the tensor is stored in an uncompressed format (e.g., the data of the tensor is being stored contiguously in memory). Dense storage of a tensor is described below in connection with FIG. 5.

In some examples, the post-processing circuitry 106 generates an example sparsity map 216. In examples disclosed herein, the sparsity map 216 indicates whether a data point of the uncompressed tensor (e.g., the dense storage 214) is zero. The sparsity map 216 enables compression of the tensor. Thus, the example post-processing circuitry 106 generates example static storage elements 218. The example post-processing circuitry 106 generates example pointers 220. The example pointers 220 store start addresses of storage elements of the tensor in memory. In some examples, the post-processing circuitry 106 stores the pointers 220 in a pointer table. An example pointer table is described below in connection with FIG. 13. The post-processing circuitry 106 generates example dynamic storage elements 222 based on the pointers 220.

During the example halo broadcast stage 206, the post-processing circuitry 106 broadcasts tensor halo regions. For example, the post-processing circuitry 106 transmits data stored in the border region of a tensor workload to other compute units. In some examples, the post-processing circuitry 106 performs a serial broadcast (e.g., data points of the halo region of a first compute unit are replicated to a second compute unit). Additionally or alternatively, the post-processing circuitry 106 performs a parallel broadcast (e.g., data points of the halo region of a first compute unit are replicated to K number of compute units). During the example storage stage 208, the post-processing circuitry 106 stores the tensor (e.g., the static storage elements 218 and/or the dynamic storage elements 222) in memory (e.g., the local memory 108 of FIGS. 1 and/or 2).

Figure 3:
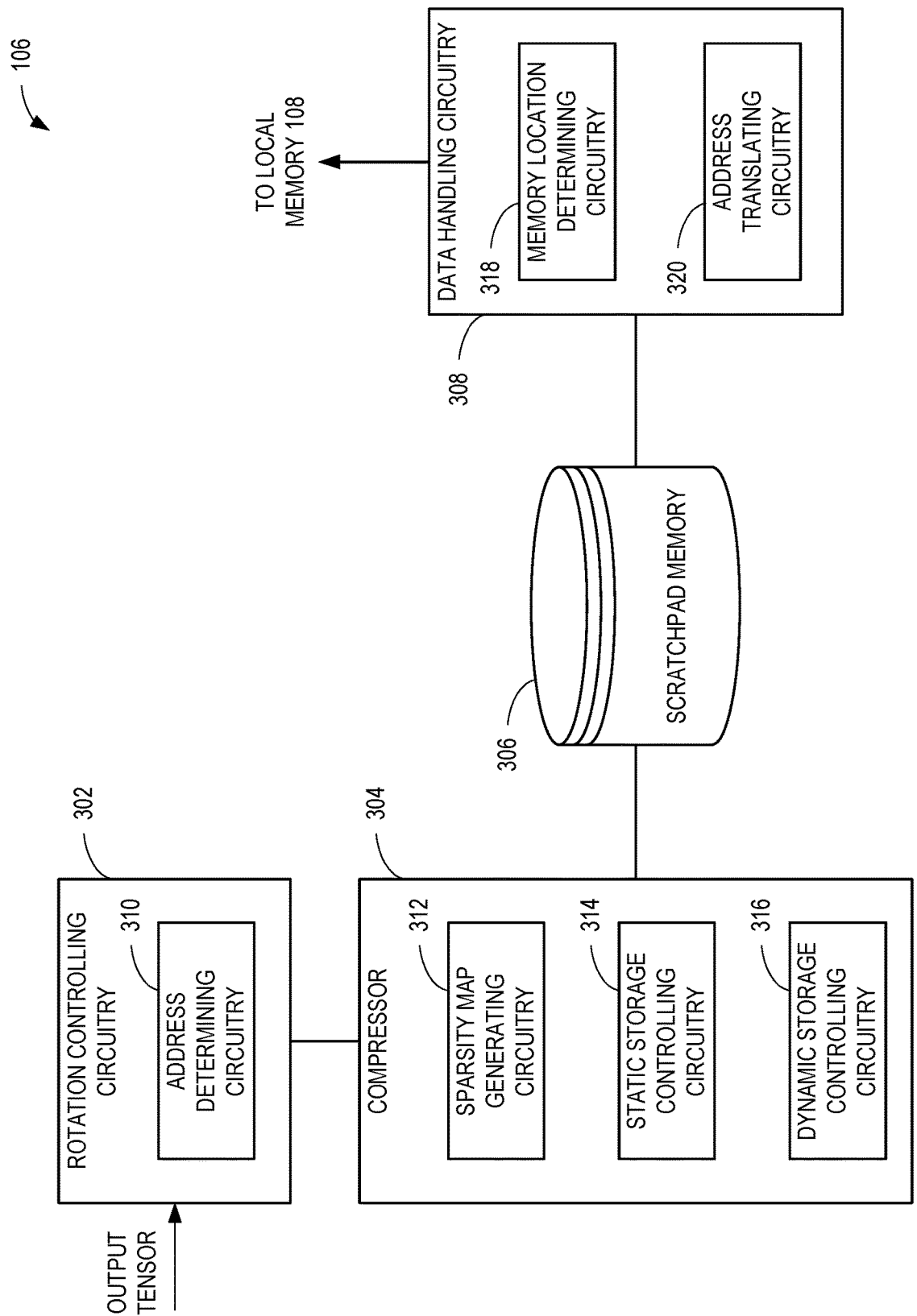
FIG. 3 is a block diagram representative of example post-processing circuitry of the example tensor storage system of FIG. 1.

FIG. 3 is a block diagram representative of the example post-processing circuitry 106 of the example tensor storage system 100 of FIG. 1. The example post-processing circuitry 106 includes example rotation controlling circuitry 302, an example compressor 304, an example scratchpad memory 306, and example data handling circuitry 308.

The example rotation controlling circuitry 302 rotates tensors. For example, the rotation controlling circuitry 302 obtains a tensor (e.g., the output tensor 210 of FIG. 2) and determines whether to rotate the tensor. That is, in examples disclosed herein, the NN accelerator 102 (FIG. 1) rotates tensors. If the rotation controlling circuitry 302 determines to rotate the tensor, the rotation controlling circuitry 302 determines the rotation of the tensor (e.g., a target orientation). For example, the rotation controlling circuitry 302 can obtain a tensor in ZXY format and determine to rotate the tensor to ZYX format.

The example rotation controlling circuitry 302 includes example address determining circuitry 310. If the example rotation controlling circuitry 302 determines to rotate the tensor, the example address determining circuitry 310 determines the address in memory (e.g., the local memory 108 of FIG. 1) to store the points of the tensor. The example address determining circuitry 310 determines primary values (e.g., OX, OY, OZ) of the tensor. In examples disclosed herein, the primary values of the tensor correspond to the dimensions of the tensor. Primary values of a tensor are described below in connection with FIG. 10.

The example address determining circuitry 310 determines secondary values of the tensor based on the primary values and the target rotation. For example, the address determining circuitry 310 determines the secondary values based on example Table 1.

TABLE 1

| | | | Secondary Values | | | |
|---|---|---|---|---|---|---|
| Rotation | a | b | c | $len_a$ | $Len_c$ | $e_{offset}$ |
| ZXY | x | y | z | OX | OZ | OX |
| ZYX | y | x | z | OY | OZ | 1 |
| YXZ | x | z | y | OX | OY | OX |
| YZX | z | x | y | OZ | OY | 1 |
| XZY | z | y | x | OZ | OX | OX |
| XYZ | y | z | x | OY | OX | 1 |

For example, the secondary values include the variables a, b, c, $len_a$, $len_c$, and $e_{offset}$. The example address determining circuitry 310 determines the variables a, b, and c based on the coordinates (e.g., X, Y, and Z) of the data point in the tensor. The example address determining circuitry 310 determines the variables $len_a$, $len_c$ and $e_{offset}$ based on the primary values of the tensor.

The example address determining circuitry 310 determines the address (e.g., a memory start byte) for the rotated tensor based on example Equation 1.

$$ADR(i)=(b*len_a+a+i*e_{offset})*d+c*\text{scaling} \qquad \text{Equation 1}$$

The variable i is the engine i (e.g., a compute unit) processing the data point. The variable scaling is the scaling factor. The example address determining circuitry 310 determines the scaling variable based on example Equation 2.

$$\text{scaling} = \frac{4}{2^{5-\log_2 DATAWIDTH}} \qquad \text{Equation 2}$$

The variable datawidth is the size of the data point (e.g., 1, 2, 4, 8, 16, or 32 bits). The example address determining circuitry 310 determines the variable d of example Equation 1 based on the alignment of the tensor. For example, the address determining circuitry 310 determines the variable d based on example Table 2.

TABLE 2

| | d |
|---|---|
| Byte Alignment (Superdense) | $len_c$ * scaling |
| 16-Byte Alignment | [$len_c$ * scaling/16] * 16 |

Example Table 2 illustrates two data alignments of the tensor: 1-byte alignment (e.g., superdense) and 16-byte alignment. For example, the address determining circuitry 310 determines d based on the secondary values (e.g., $len_c$) and the scaling factor. The tensor alignment is described below in connection with FIG. 6. Thus, the rotation controlling circuitry 302 rotates the tensor based on the calculated addresses determined by the example address determining circuitry 310.

The example compressor 304 compresses the tensor. For example, the compressor 304 obtains the tensor from the rotation controlling circuitry 302. In some examples, the tensor is uncompressed (e.g., stored in dense format). In the illustrated example of FIG. 3, the compressor 304 includes example sparsity map generating circuitry 312, example static storage controlling circuitry 314, and example dynamic storage controlling circuitry 316.

The example sparsity map generating circuitry 312 generates a sparsity map. As described above, the sparsity map indicates which data points of the uncompressed (e.g., dense) tensor are zero. In examples disclosed herein, the sparsity map is a binary tensor. For example, if a data point of the uncompressed tensor is not zero, the sparsity map generating circuitry 312 determines the corresponding bit of the sparsity map is 1. If a data point of the uncompressed tensor is zero, the sparsity map generating circuitry 312 determines the corresponding bit of the sparsity map is 0. In examples disclosed herein, the size of the sparsity map is based on the data size of the data points of the tensor. For example, if the tensor data is 8, 16, or 32-bit data, the sparsity map is the same size (e.g., the same dimensions) as the tensor. Additionally or alternatively, if the data points of the tensor are 4-bit data, the sparsity map is half the size of the tensor. That is, two tensor points correspond to one sparsity map bit. In some such examples, the sparsity map generating circuitry 312 determines that the sparsity bit is 0 in response to both 4-bit points of the tensor being 0. Additionally or alternatively, if the data points of the tensor are 2-bit data, the sparsity map is a quarter of the size of the tensor (e.g., four tensor points correspond to one sparsity bit). Additionally or alternatively, if the data points of the tensor are 1-bit data, the sparsity map is an eighth of the size of the tensor (e.g., eight tensor points correspond to one sparsity bit).

In some examples, the sparsity map generating circuitry 312 stores the sparsity map in the scratchpad memory 306. In some examples, the sparsity map is stored in the same format (e.g., rotation) as the uncompressed tensor. For example, if the uncompressed tensor is stored in the ZXY format, the sparsity map is stored in the ZXY format. An example first uncompressed tensor is illustrated in example Table 3.

TABLE 3

| 42 | 0 | 0 | 231 | 45 | 2 | 0 | 1 | 0 | 12 |
|---|---|---|---|---|---|---|---|---|---|

In some examples, the tensor data illustrated in Table 3 is 8, 16, or 32-bit wide. The example sparsity map generating circuitry 312 generates an example sparsity map illustrated in example Table 4.

TABLE 4

| 1 | 0 | 0 | 1 | 1 | 1 | 0 | 1 | 0 | 1 |
|---|---|---|---|---|---|---|---|---|---|

The example uncompressed tensor and the example sparsity map of Tables 3, 4 have a dimension of 10×1×1. The sparsity map of Table 4 indicates which points of the uncompressed tensor of Table 3 are zero. An example second uncompressed tensor is illustrated in example Table 5.

TABLE 5

| 0 | 15 | 3 | 0 | 0 | 0 | 0 | 0 | 1 | 12 | 0 | 11 | 0 | 0 | 3 | 5 |
|---|---|---|---|---|---|---|---|---|---|---|---|---|---|---|---|

In some examples, the tensor data illustrated in Table 5 is 4-bit wide data. The sparsity map generating circuitry 312 generates an example sparsity map illustrated in example Table 6.

TABLE 6

| 1 | 1 | 0 | 0 | 1 | 1 | 0 | 1 |
|---|---|---|---|---|---|---|---|

The example sparsity map of example Table 6 corresponds to the tensor of example Table 5. That is, the size of the sparsity map is half the size of the tensor. For example, two data points of the tensor of Table 5 correspond to 1 data point of the sparsity map of Table 6. An example third uncompressed tensor is illustrated in example Table 7.

TABLE 7

| 0 | 1 | 3 | 0 | 0 | 0 | 0 | 0 | 1 | 2 | 1 | 2 | 0 | 0 | 0 | 0 |
|---|---|---|---|---|---|---|---|---|---|---|---|---|---|---|---|

In some examples, the tensor data illustrated in Table 7 is 2-bit wide data. The example sparsity map generating circuitry 312 generates an example sparsity map illustrated in example Table 8.

TABLE 8

| 1 | 0 | 1 | 0 |
|---|---|---|---|

The example sparsity map of example Table 8 corresponds to the tensor of example Table 7. That is, the size of the sparsity map is a quarter of the size of the tensor. For example, four data points of the tensor of Table 7 correspond to 1 data point of the sparsity map of Table 8. An example fourth uncompressed tensor is illustrated in example Table 9.

TABLE 9

| 0 | 0 | 0 | 0 | 0 | 0 | 0 | 0 | 1 | 1 | 1 | 0 | 0 | 0 | 0 | 0 |
|---|---|---|---|---|---|---|---|---|---|---|---|---|---|---|---|

In some examples, the tensor data illustrated in Table 9 is 1-bit wide data. The example sparsity map generating circuitry 312 generates an example sparsity map illustrated in example Table 10.

TABLE 10

| 0 | 1 |
|---|---|

The example sparsity map of example Table 10 corresponds to the tensor of example Table 9. That is, the size of the sparsity map is an eighth of the size of the tensor. For example, eight data points of the tensor of Table 9 correspond to 1 data point of the sparsity map of Table 10.

The example static storage controlling circuitry 314 compresses the uncompressed tensor. The example static storage controlling circuitry 314 divides the uncompressed tensor into storage elements. As used herein, a storage element is a tensor with relatively smaller dimensions. As an example base case for ZXY data, the data along the Z axis for a particular XY coordinate pair is a single storage element. However, in some examples, the static storage controlling circuitry 314 determines a number of storage elements to divide a tensor into along an axis. For example, the static storage controlling circuitry 314 can determine to divide the tensor into two storage elements along the Z axis. However, the static storage controlling circuitry 314 can additionally or alternatively determine to divide the tensor into a greater or fewer number of storage elements along the X, Y, and/or Z axis (e.g., three storage elements along the Z axis, etc.). Storage elements are described below in connection with FIG. 11. Additionally or alternatively, the static storage controlling circuitry 314 determines to not divide the uncompressed tensor into storage elements.

The example static storage controlling circuitry 314 compresses the tensor. For example, the static storage controlling circuitry 314 removes the zero data points from the storage elements. That is, the non-zero data points of the storage elements are stored contiguously in memory. In examples disclosed herein, a storage element that contains only zeros does not occupy space in memory (e.g., the storage element is not stored). Thus, the memory requirements of storage elements are reduced, resulting in fewer memory transactions to and from the accelerators. In some examples, the static storage controlling circuitry 314 stores the static, compressed tensor in the local memory 108 of FIG. 1.

The static storage controlling circuitry 314 stores the start of the storage elements at the same corresponding memory location as the uncompressed tensor. That is, in some examples, the start locations of the storage elements in memory are fixed. Thus, the static storage controlling circuitry 314 stores the tensor in a static format. In some examples, the memory footprint of the tensor stored in static format is the same as the memory footprint of the uncompressed tensor. Because the start locations of the storage elements are known (e.g., the start locations are fixed), the NN controlling circuitry 104 can perform random access of the storage elements. For example, random access may be performed in a subsequent step, in which the output tensor is an input tensor to the next convolution. For example, the NN controlling circuitry 104 determines an offset based on the sparsity map to access a specific point of data inside a storage element. The smaller the size of the storage element (e.g., determined by the example static storage controlling circuitry 314), the faster access to a specific data point is possible. However, the static storage controlling circuitry 314 cannot decrease the memory footprint as much with smaller storage elements. A tensor stored in the static format is described below in connection with FIG. 12.

In some examples, the static storage controlling circuitry 314 moves the start points of the storage elements closer to each other (e.g., the static storage controlling circuitry 314 reduces the memory footprint). That is, the memory footprint reserved for the tensor is reduced. That is, in some examples, the post-processing circuitry 106 includes a sparsity threshold. In some such examples, the sparsity threshold indicates an expected sparsity of the tensors (e.g., an expected number, percentage, etc. of zeros). For example, the sparsity threshold can be user defined, configured by a compiler, etc. The example static storage controlling circuitry 314 stores the storage elements based on the sparsity threshold. In some examples, the static storage controlling circuitry 314 detects violations. For example, the storage elements may exceed the sparsity threshold, and thus, use more memory than allocated. In some examples, in response to detecting violations, the static storage controlling circuitry 314 reallocates the amount of memory reserved for the tensor.

Additionally or alternatively, the static storage controlling circuitry 314 does not move the start locations of the storage elements. For example, the static storage controlling circuitry 314 stores the storage elements in the local memory 108. The example static storage controlling circuitry 314 determines the maximum amount of data stored in the storage elements of the tensor. That is, the static storage controlling circuitry 314 determines the storage element that stores the most data (e.g., the least non-zero points). In some examples, a DMA transfers the compressed footprint to another memory region (e.g., in the local memory 108, a larger memory of the computing device, etc.). For example, the DMA can use stride settings to transfer the compressed memory footprint based on the maximum amount of data in a storage element, and thus, omit transferring unused memory regions.

In some examples, the static storage controlling circuitry 314 restricts the location of the storage elements in memory. For example, the static storage controlling circuitry 314 determines the start location of the storage elements is a memory word boundary. In such examples, the memory footprint of the tensor is relatively larger than storage elements stored with no restrictions on the start location (e.g., packed together).

The example dynamic storage controlling circuitry 316 compresses the static, compressed tensor to generate a dynamic, compressed tensor. As described above, the static, compressed tensor includes compressed storage elements (e.g., the storage elements do not include zeros). That is, the storage elements of the static, compressed tensor are located at predetermined memory locations. The example dynamic storage controlling circuitry 316 compresses the storage elements and stores the start locations of the storage elements in a pointer table. That is, the pointer table enables access to the storage locations. Because the storage elements are not stored at fixed locations in memory, the dynamic storage controlling circuitry 316 can store the storage elements closer together in memory and, thus, the memory footprint decreases with respect to the static, compressed tensor. In some examples, the dynamic storage controlling circuitry 316 stores the start addresses of the storage elements in the pointer table in ascending order of the storage element number. In some examples, the dynamic storage controlling circuitry 316 stores the dynamic, compressed tensor and/or the pointer table in the local memory 108. An example pointer table is described below in connection with FIG. 13. An example dynamic, compressed tensor is described below in connection with FIG. 14.

The example scratchpad memory 306 stores tensor data. For example, the scratchpad memory 306 stores the sparsity map generated by the sparsity map generating circuitry 312. Additionally or alternatively, the scratchpad memory 306 stores the static tensor generated by the static storage controlling circuitry 314 and/or the dynamic tensor generated by the dynamic storage controlling circuitry 316. That is, the post-processing circuitry 106 can aggregate tensor data before transmitting the tensor data to memory (e.g., the local memory 108) to improve bandwidth utilization. In some examples, the local memory 108 stores output activations (e.g., uncompressed, dense format). Additionally or alternatively, the local memory 108 stores the output activations (e.g., compressed format) and a sparsity map. Additionally or alternatively, the local memory 108 stores output activations (e.g., compressed format), a sparsity map, and a pointer table. The data handling circuitry 308 determines the maximum number of bytes that are written into memory in a single transaction based on example Table 11.

The data handling circuitry 308 determines the maximum number of bytes based on the NTHW mode. In examples disclosed herein, the "NTHW mode" refers to a data re-use configuration. Example NTHW modes are described below in connection with FIGS. 7A-7C. For example, the NTHW mode determines the order tensor data is transmitted (e.g., the location of the tile segments obtained). In example Table 11, the number of bytes is based on 8-bit data. However, if 16 or 32-bit data is used, the number of bytes scales up by 2 or 4, respectively, to a maximum number of 16 bytes per memory transaction. Additionally or alternatively, for 1, 2, or 4-bit data, the number of bytes is scaled down by 8, 4, or 2, respectively. Additionally or alternatively, the post-processing circuitry 106 does not include the scratchpad memory 306. In some such examples, the post-processing circuitry 106 stores the tensor data directly in the local memory 108 (FIG. 1).

The example scratchpad memory 306 of the illustrated example of FIG. 3 is implemented by any memory, storage device and/or storage disc for storing data such as, for example, flash memory, magnetic media, optical media, solid state memory, hard drive(s), thumb drive(s), etc. Furthermore, the data stored in the example scratchpad memory 306 may be in any data format such as, for example, binary data, comma delimited data, tab delimited data, structured query language (SQL) structures, etc. While, in the illustrated example, the scratchpad memory 306 is illustrated as a single device, the example scratchpad memory 306 and/or any other data storage devices described herein may be implemented by any number and/or type(s) of memories.

The example data handling circuitry 308 transmits tensor data. In some examples, the data handling circuitry 308 stores the dynamic tensor in the local memory 108. Additionally or alternatively, the data handling circuitry 308 performs tensor halo broadcast. That is, the data handling circuitry 308 transmits and/or replicates the tensor data to other compute units. For example, a tensor can be divided into one or more compute units. For example, one compute unit can process one workload (e.g., data stored in the tensor). The workload has a width, W, a height, H, and a depth, D. In some examples, a first compute unit generates an output required by a second compute unit. However, the second compute unit may not require all of the data of the workload of the first compute unit. In some examples, the required output generated by the first compute unit is stored in a border region of the workload. In examples disclosed herein, the border region of the workload has a border width, $B_W$, and a border height, $B_H$. Thus, with a kernel size of $2B_W+1 \times 2B_H+1$, the example data handling circuitry 308 replicates the bordering regions of the first compute unit to corresponding compute units (e.g., the second compute unit). In some examples, the tensor workload width and height are padded by the border width and the border height. That is, the overall size is $W+2B_W \times H+2B_H$. The padded area of the tensor workload is populated by other compute units (e.g., the padded area is part of the tensor workload of an adjacent compute unit). An example tensor workload is described below in connection with FIG. 15. In the illustrated example of FIG. 3, the data handling circuitry 308 includes an example memory location determining circuitry 318 and an example address translating circuitry 320.

The example memory location determining circuitry 318 identifies a data point of the tensor workload to transmit. For example, the data point corresponds to coordinates (X, Y, Z) of the tensor workload. The example memory location determining circuitry 318 determines whether the data point is located in the border region of the tensor workload. The

TABLE 11

| | | Rotation | | |
|---|---|---|---|---|
| | | ZXY ZYX | YZX YXZ | XYZ XZY |
| NTHW | 4 | 16 | 8 | 8 |
| | 8 | 16 | 8 | 16 |
| | 16 | 16 | 16 | 16 | memory location determining circuitry 318 determines whether the data point is in the border region based on example Table 12.

TABLE 12

| Comparison | Logic |
|---|---|
| CL | $X < B_W$ |
| CT | $Y < B_H$ |
| CR | $X \geq W - B_W$ |
| CB | $Y \geq H - B_H$ |

For example, the memory location determining circuitry 318 performs four comparisons, CL, CT, CR, and CB. That is, the memory location determining circuitry 318 determines whether the four comparisons are true. For example, if the memory location determining circuitry 318 determines the X coordinate of the data point is less than the border width, the CL comparison is true.

Figure 5:
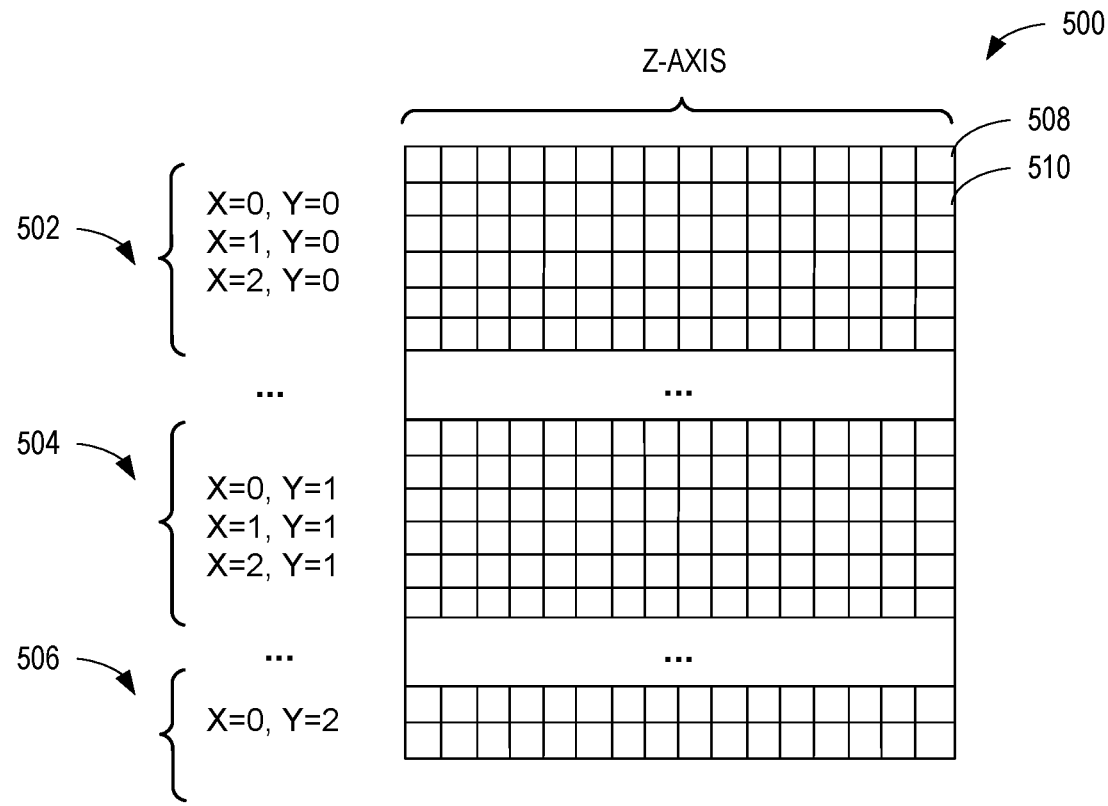
FIG. 5 illustrates example uncompressed tensor data stored in example memory.

The example memory location determining circuitry 318 determines the location of the data point in the tensor workload based on the comparisons of FIG. 5. In examples disclosed herein, the tensor workload includes nine regions: a top left region (TL), a top region (T), a top right region (TR), a left region (L), a core region, a right region (R), a bottom left region (BL), a bottom region (B), and a bottom right region (BR). The example memory location determining circuitry 318 determines the location of the data point in the tensor based on example Table 13.

TABLE 13

| Condition | Region |
|---|---|
| CL | L |
| CL & CT | TL |
| CL & CB | BL |
| CR | R |
| CR & CT | TR |
| CR & CB | TB |
| CT | T |
| CB | B |
| ~ | Core |

The example memory location determining circuitry 318 determines which of the comparisons of Table 12 are true to determine the region the data point is located in. For example, if the memory location determining circuitry 318 determines only the CL comparison is true, the memory location determining circuitry 318 determines the data point is located in the left region. Additionally or alternatively, if the memory location determining circuitry 318 determines none of the comparisons of Table 12 are true, the memory location determining circuitry 318 determines the data point is located in the core region.

The example address translating circuitry 320 determines the address to transmit the data point to. For example, the address translating circuitry 320 determines whether the data point is located in the border region (e.g., TL, T, TR, L, R, BL, B, or BR). If the address translating circuitry 320 determines the data point is located in the border region, the address translating circuitry 320 determines the address of other compute units to replicate the data point to. Address translation logic is described below in connection with FIG. 16.

Figure 4:
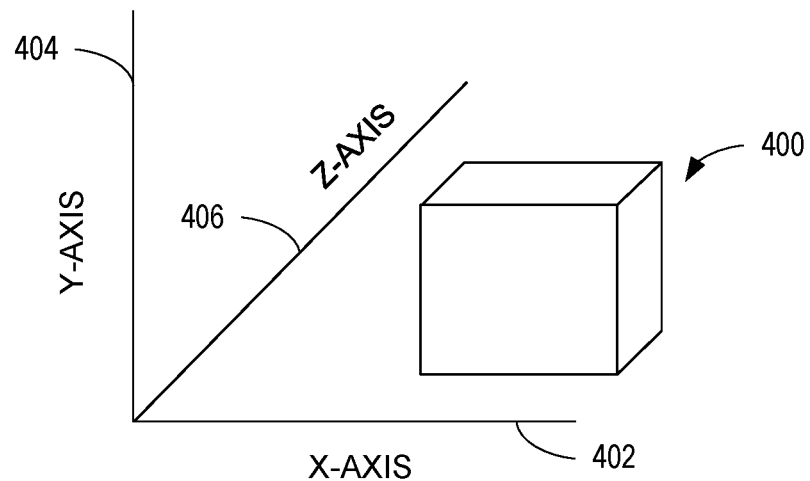
FIG. 4 illustrates an example tensor.

FIG. 4 illustrates an example tensor 400. In the illustrated example of FIG. 4, the tensor 400 is three-dimensional. Examples disclosed herein traverse the tensor 400 along an example X axis 402, an example Y axis 404, and an example Z axis 406. In some examples, the tensor 400 is stored in an uncompressed (e.g., dense) format.

FIG. 5 illustrates example uncompressed tensor data stored in example memory 500. For example, the memory 500 stores the tensor 400 (FIG. 4). In the illustrated example of FIG. 5, the tensor 400 is stored in the ZXY format. That is, the tensor 400 is split into ZX planes that are stored consecutively. For example, the memory 500 stores an example first ZX plane 502, an example second ZX plane 504, and an example third ZX plane 506. The example first ZX plane 502 corresponds to the tensor data of the tensor 400 when Y=0, the example second ZX plane 504 corresponds to the tensor data of the tensor 400 when Y=1, and the example third ZX plane 506 corresponds to the tensor data of the tensor 400 when Y=2. While the illustrated example of FIG. 5 includes three ZX planes 502, 504, 506, examples disclosed herein can include a fewer or greater number of ZX planes (e.g., corresponding to the Y dimension of the tensor 400).

The example post-processing circuitry 106 (FIG. 1) traverses the Z axis. For example, the post-processing circuitry 106 stores an example first row of data 508 based on traversing the Z axis for X=0, Y=0. When the post-processing circuitry 106 finishes traversing the Z axis, the post-processing circuitry 106 increments X by 1 and traverses the Z axis (e.g., X=1, Y=0) to generate an example second row 510, etc. The example post-processing circuitry 106 stores the data of the tensor 400 contiguously in the memory 500 (e.g., the local memory 108 of FIG. 1).

Figure 6:
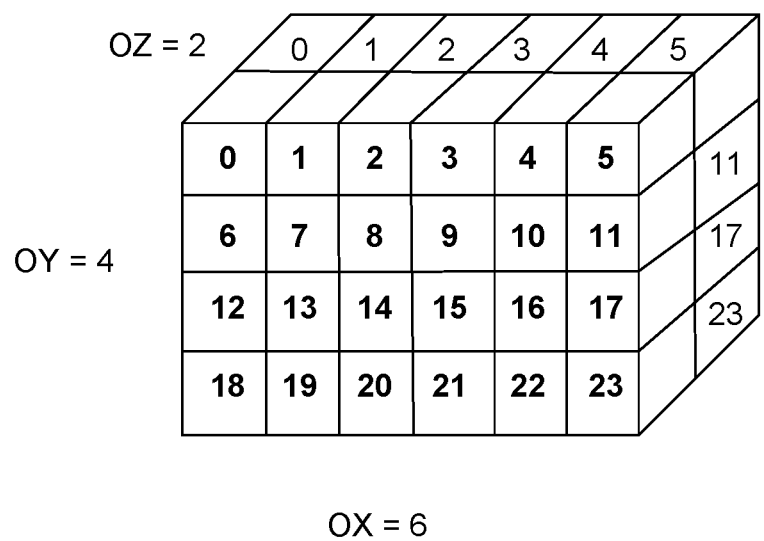
FIG. 6 illustrates an example tensor.

FIG. 6 illustrates an example tensor 600. The example tensor 600 has a size of 6×4×2 (e.g., OX=6, OY=4, and OZ=2). In some examples, the data width of each point of the tensor 600 is 8-bit. The example post-processing circuitry 106 (FIG. 1) stores the tensor 600 in ZXY format in 1-byte alignment (e.g., superdense) storage, illustrated in example Table 14.

TABLE 14

| | Address | | | | | | | | | | | | | | | |
|---|---|---|---|---|---|---|---|---|---|---|---|---|---|---|---|---|
| 0x00 | 7 | 7 | 6 | 6 | 5 | 5 | 4 | 4 | 3 | 3 | 2 | 2 | 1 | 1 | 0 | 0 |
| 0x10 | 15 | 15 | 14 | 14 | 13 | 13 | 12 | 12 | 11 | 11 | 10 | 10 | 9 | 9 | 8 | 8 |
| 0x20 | 23 | 23 | 22 | 22 | 21 | 21 | 20 | 20 | 19 | 19 | 18 | 18 | 17 | 17 | 16 | 16 |

That is, the post-processing circuitry 106 traverses the tensor 600 along the ZX plane (e.g., 0, 0, 1, 1, etc.). In the illustrated example of FIG. 6, the bold data point indices correspond to data points of the XY plane for Z=0 (e.g., the front plane). Additionally or alternatively, the post-processing circuitry 106 stores the tensor 600 in ZYX format in superdense storage, illustrated in example Table 15.

TABLE 15

| Address | | | | | | | | | | | | | | | |
|---|---|---|---|---|---|---|---|---|---|---|---|---|---|---|---|
| 0x00 | 19 | 19 | 13 | 13 | 7 | 7 | 1 | 1 | 18 | 18 | 12 | 12 | 6 | 6 | 0 | 0 |
| 0x10 | 21 | 21 | 15 | 15 | 9 | 9 | 3 | 3 | 20 | 20 | 14 | 14 | 8 | 8 | 2 | 2 |
| 0x20 | 23 | 23 | 17 | 17 | 11 | 11 | 5 | 5 | 22 | 22 | 16 | 16 | 10 | 10 | 4 | 4 |

That is, the post-processing circuitry 106 traverses the tensor 600 along the ZY plane (e.g., 0, 0, 6, 6, etc.). In examples disclosed herein, for the byte-alignment setting, the tensor data is stored in memory contiguously. That is, the tensor data does not include empty bytes in memory.

In some examples, the post-processing circuitry 106 determines to store the tensor 600 in 16-byte alignment storage in ZXY format, illustrated in example Table 16.

TABLE 16

| Address | | |
|---|---|---|
| 0x00 | 0 | 0 |
| 0x10 | 1 | 1 |
| 0x20 | 2 | 2 |
| 0x30 | 3 | 3 |
| 0x40 | 4 | 4 |
| 0x50 | 5 | 5 |
| 0x60 | 6 | 6 |
| 0x70 | 7 | 7 |
| 0x80 | 8 | 8 |
| 0x90 | 9 | 9 |
| 0xA0 | 10 | 10 |
| 0xB0 | 11 | 11 |
| 0xC0 | 12 | 12 |
| 0xD0 | 13 | 13 |
| 0xE0 | 14 | 14 |
| 0x0F0 | 15 | 15 |
| 0x100 | 16 | 16 |
| 0x110 | 17 | 17 |
| 0x120 | 18 | 18 |
| 0x130 | 19 | 19 |
| 0x140 | 20 | 20 |
| 0x150 | 21 | 21 |
| 0x160 | 22 | 22 |
| 0x170 | 23 | 23 |

Additionally or alternatively, the post-processing circuitry 106 determines to store the tensor 600 in 16-byte alignment storage in ZYX format, illustrated in example Table 17.

TABLE 17

| Address | | |
|---|---|---|
| 0x00 | 0 | 0 |
| 0x10 | 6 | 6 |
| 0x20 | 12 | 12 |
| 0x30 | 18 | 18 |
| 0x40 | 1 | 1 |
| 0x50 | 7 | 7 |
| 0x60 | 13 | 13 |
| 0x70 | 19 | 19 |
| 0x80 | 2 | 2 |
| 0x90 | 8 | 8 |
| 0xA0 | 14 | 14 |
| 0xB0 | 20 | 20 |
| 0xC0 | 3 | 3 |
| 0xD0 | 9 | 9 |
| 0xE0 | 15 | 15 |
| 0x0F0 | 21 | 21 |
| 0x100 | 4 | 4 |
| 0x110 | 10 | 10 |
| 0x120 | 16 | 16 |
| 0x130 | 22 | 22 |
| 0x140 | 5 | 5 |
| 0x150 | 11 | 11 |
| 0x160 | 17 | 17 |
| 0x170 | 23 | 23 |

TABLE 17-continued

The storage of the tensor 600 in 16-byte alignment storage (e.g., the data of example Tables 9, 10) requires relatively more memory than 1-byte alignment storage. In examples disclosed herein, for the 16-byte alignment setting, tensor data is stored in memory such that the first rotation axis starts on the 16-byte boundary.

Figure 7A:
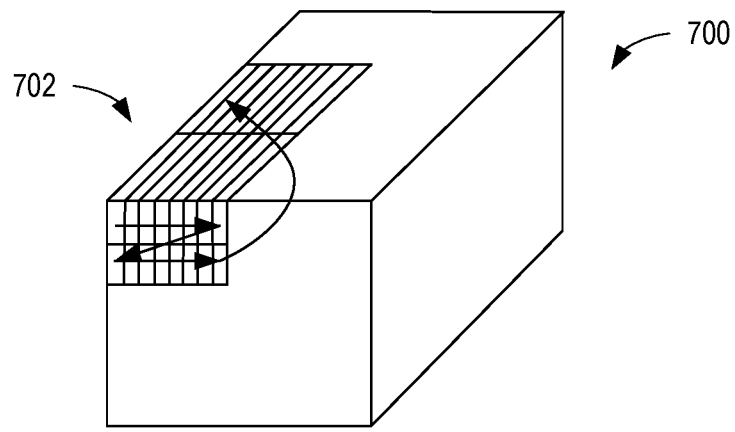
FIGS. 7A-7C illustrate example NTHW traversal modes of a tensor.

FIG. 7A illustrates an example first NTHW traversal mode of an example tensor 700. The example tensor 700 includes example tile segments 702. In some examples, the tile segments 702 correspond to the tile segments 110 (FIG. 1). For example, the tile segments 702 have a size of 1×4×16. The example NN controlling circuitry 104 (FIG. 1) traverses the tensor 700 using the first NTHW traversal mode. In the illustrated example of FIG. 7A, the first NTHW traversal mode is NTHW=4. That is, the NN controlling circuitry 104 traverses the eight tile segments along the X axis (e.g., Y=0, Z=0). The NN controlling circuitry 104 increments Y by 4 and traverses eight tile segments along the X axis (e.g., Y=4, Z=0). The NN controlling circuitry 104 increments Z by 16 and traverse eight tile segments along the X axis (e.g., Y=0, Z=16).

Figure 7B:
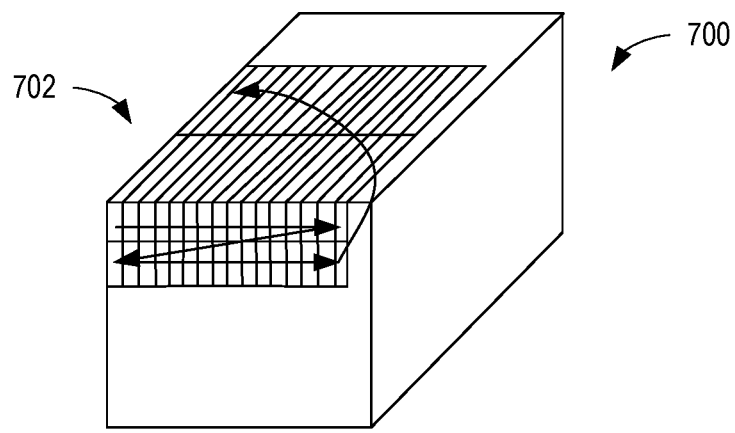

FIG. 7B illustrates an example second NTHW traversal mode of the example tensor 700 (FIG. 7A). The example NN controlling circuitry 104 (FIG. 1) traverses the tensor 700 using the second NTHW traversal mode. In the illustrated example of FIG. 7B, the second NTHW traversal mode is NTHW=8. That is, the NN controlling circuitry 104 traverses the 16 tile segments along the X axis (e.g., Y=0, Z=0). That is, with respect to NTHW=4, NTHW=8 traverses 16 tile segments along the X axis before incrementing the Y axis. The NN controlling circuitry 104 increments Y by 4 and traverses 16 tile segments along the X axis (e.g., Y=4, Z=0). The NN controlling circuitry 104 increments Z by 16 and traverses 16 tile segments along the X axis (e.g., Y=0, Z=16).

Figure 7C:
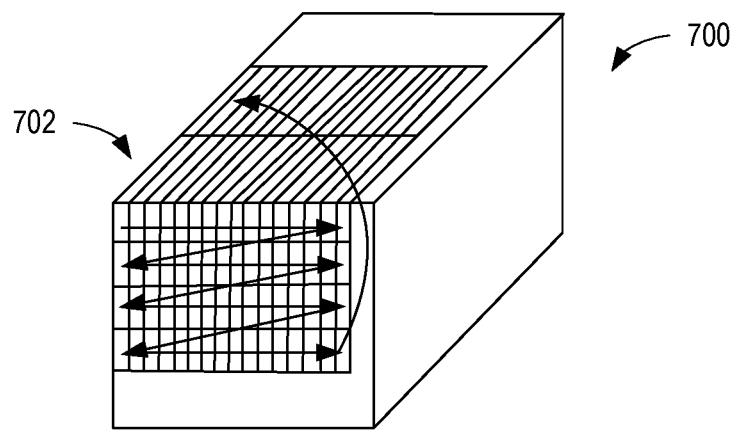

FIG. 7C illustrates an example third NTHW traversal mode of the example tensor 700 (FIG. 7A). The example NN controlling circuitry 104 (FIG. 1) traverses the tensor 700 using the third NTHW traversal mode. In the illustrated example of FIG. 7C, the third NTHW traversal mode is NTHW=16. That is, the NN controlling circuitry 104 traverses the 16 tile segments along the X axis (e.g., Y=0, Z=0). The NN controlling circuitry 104 increments Y by 4 and traverses 16 tile segments along the X axis (e.g., Y=4, Z=0). The NN controlling circuitry 104 increments Y by 4 and traverses 16 tile segments along the X axis (e.g., Y=8, Z=0). The NN controlling circuitry 104 increments Y by 4 and traverses 16 tile segments along the X axis (e.g., Y=16, Z=0). That is, with respect to NTHW=8, NTHW=16 traverses four tile segments along the Y axis before incrementing the Z axis. The NN controlling circuitry 104 increments Z by 16 and traverses 16 tile segments along the X axis (e.g., Y=0, Z=16).

Figure 8:
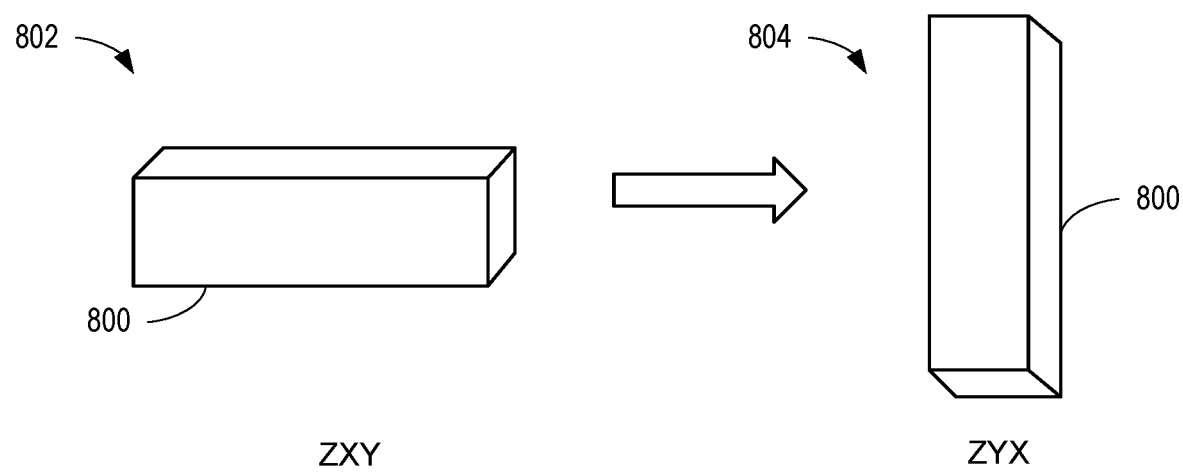
FIG. 8 illustrates an example tensor rotation.

FIG. 8 illustrates an example tensor rotation. The illustrated example of FIG. 8 includes an example tensor 800. The illustrated example of FIG. 8 includes the tensor 800 at an example first orientation 802. For example, the first orientation 802 corresponds to the ZXY format. In some examples, the rotation controlling circuitry 302 (FIG. 3) rotates the tensor 800 from the first orientation 802 to an example second orientation 804. For example, the second orientation 804 is the ZYX format. That is, the rotation controlling circuitry 302 permutes the axes of the tensor 800 to rotate the tensor 800.

Figure 9A:
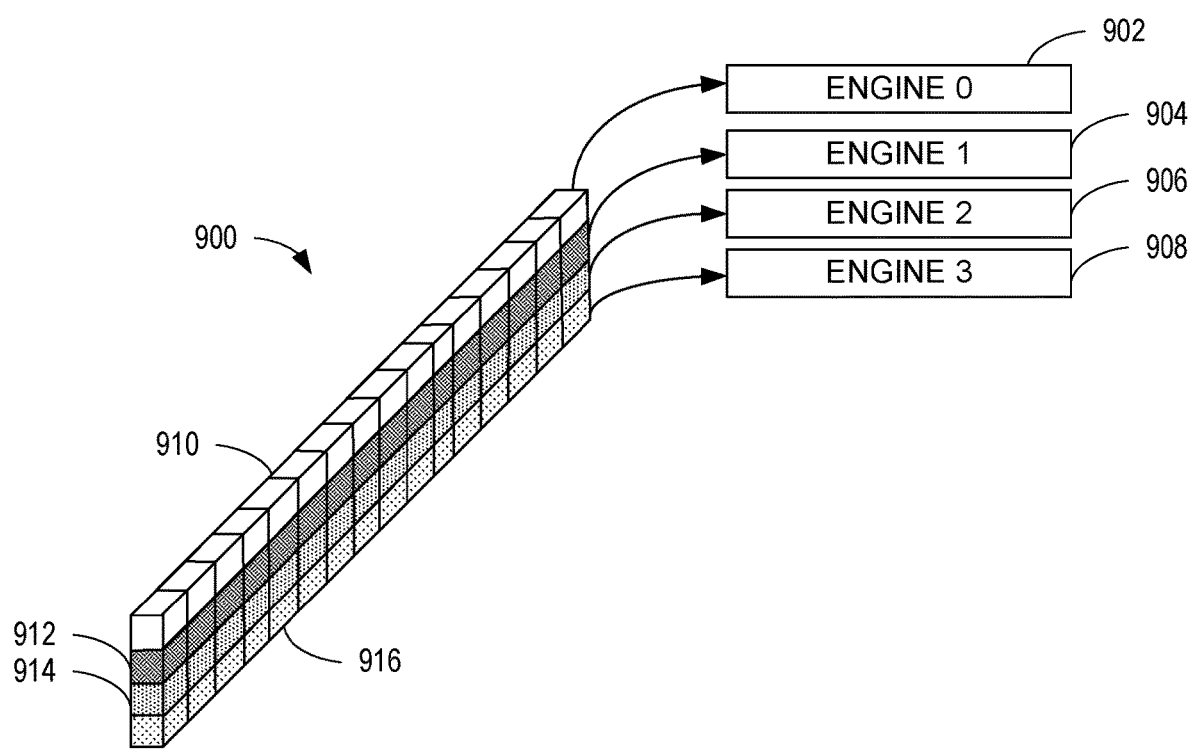
FIGS. 9A-9C illustrate example multiplexing of a tensor.

FIG. 9A illustrates an example first input multiplexing of an example tile segment 900. For example, the tile segment 900 corresponds to the tile segments 110 (FIG. 1) of a tensor. The post-processing circuitry 106 obtains the tile segment 900. The illustrated example of FIG. 9 includes an example first engine 902, an example second engine 904, an example third engine 906, and an example fourth engine 908. For example, the post-processing circuitry 106 implements the engines 902, 904, 906, 908. The engines 902, 904, 906, 908 process (e.g., rotate, compress, etc.) the data of the tile segment 900 to store in memory (e.g., the local memory 108 of FIG. 1). In some examples, the engines 902, 904, 906, 908 can process 16 points of 8-bit data per clock cycle. However, examples disclosed herein are not limited thereto. Thus, if the data points of the tile segment 900 are 1, 2, 4, and/or 8-bit data, the engines 902, 904, 906, 908 process the tile segment 900 in one clock cycle. If the data points of the tile segment 900 are 16-bit data, the engines 902, 904, 906, 908 process the tile segment 900 in two clock cycles. Additionally or alternatively, if the data points of the tile segment 900 are 32-bit data, the engines 902, 904, 906, 908 process the tile segment 900 in four clock cycles.

The example rotation controlling circuitry 302 (FIG. 3) determines how the data points of the tile segment 900 are assigned to the engines 902, 904, 906, 908. That is, the tensor rotation determines how the tensor data is input into the engines 902, 904, 906, 908. For example, the rotation controlling circuitry 302 determines the target orientation of the tile segment 900 is ZXY and/or ZYX. Thus, the rotation controlling circuitry 302 inputs the data of the tile segment 900 along the Z axis. That is, the rotation controlling circuitry 302 transmits an example first row 910 to the first engine 902, an example second row 912 to the second engine 904, an example third row 914 to the third engine 906, and an example fourth row 916 to the fourth engine 908. Thus, for the ZXY and ZYX orientations, it takes one clock cycles to transmit the tile segment 900 to the engines 902, 904, 906, 908 if the data points are 1, 2, 4, and/or 8-bit. In examples disclosed herein, the post-processing circuitry 106 can process and rotate the tile segment 900. That is, the post-processing circuitry 106 can rotate and process (e.g., compress, transmit data in the border region, etc.) at substantially the same time.

Figure 9B:
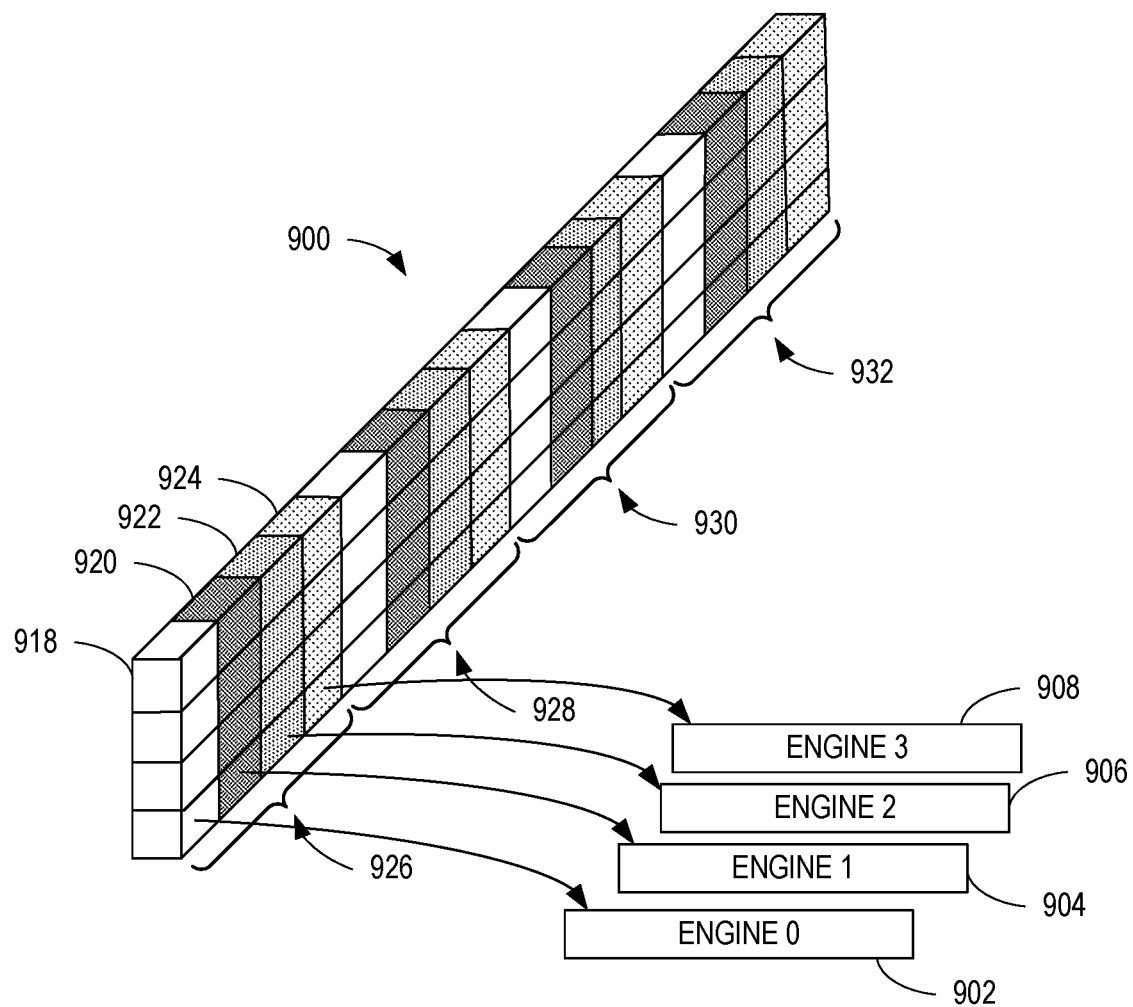

FIG. 9B illustrates an example second input multiplexing of the tile segment 900 of FIG. 9A. The illustrated example of FIG. 9B includes the engines 902, 904, 906, 908 of FIG. 9A. Thus, the above discussion of like numbered components in FIG. 9A apply equally well to the like numbered parts of FIG. 9B and, to avoid redundancy, the like numbered components of FIG. 9B will not be separately described. In the illustrated example of FIG. 9B, the rotation controlling circuitry 302 (FIG. 3) determines the target orientation of the tile segment 900 is YXZ or YZX. Thus, the rotation controlling circuitry 302 inputs the data of the tile segment 900 along the Y axis. That is, the rotation controlling circuitry 302 transmits an example first column 918 to the first engine 902, an example second column 920 to the second engine 904, an example third column 922 to the third engine 906, and an example fourth column 924 to the fourth engine 908.

The example rotation controlling circuitry 302 transmits the columns 918, 920, 922, 924 to the engines 902, 904, 906, 908 in an example first clock cycle 926. The example rotation controlling circuitry 302 transmits four columns of the tile segment 900 to the corresponding engines 902, 904, 906, 908 in an example second clock cycle 928. The example rotation controlling circuitry 302 transmits four columns of the tile segment 900 to the corresponding engines 902, 904, 906, 908 in an example third clock cycle 930. The example rotation controlling circuitry 302 transmits four columns of the tile segment 900 to the corresponding engines 902, 904, 906, 908 in an example fourth clock cycle 932. That is, for the YXZ and/or YZX orientations, it takes four clock cycles (e.g., the clock cycles 926, 928, 930, 932) to transmit the tile segment 900 to the engines 902, 904, 906, 908 independent of the data width stored in the tile segment 900.

Figure 9C:
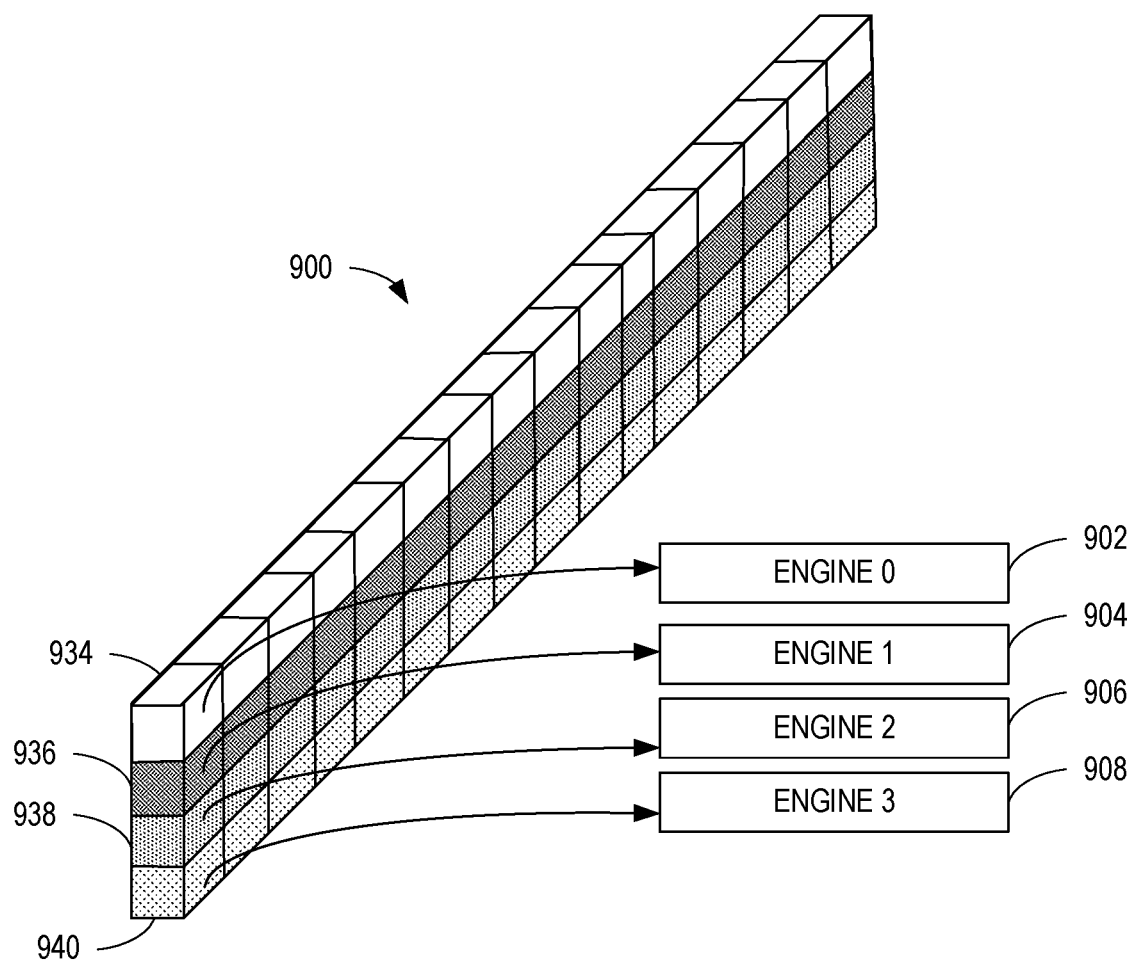

FIG. 9C illustrates an example third input multiplexing of the example tile segment 900 of FIG. 9A. The illustrated example of FIG. 9C includes the engines 902, 904, 906, 908 of FIG. 9A. Thus, the above discussion of like numbered components in FIG. 9A apply equally well to the like numbered parts of FIG. 9C and, to avoid redundancy, the like numbered components of FIG. 9C will not be separately described. In the illustrated example of FIG. 9C, the rotation controlling circuitry 302 (FIG. 3) determines the target orientation of the tile segment 900 is XYZ or XZY. That is, the rotation controlling circuitry 302 transmits an example first data point 934 to the first engine 902, an example second data point 936 to the second engine 904, an example third data point 938 to the third engine 906, and an example fourth data point 940 to the fourth engine 908. For example, the data points 934, 936, 938, 940 correspond to the first column 918 of FIG. 9B. For the XYZ and/or XZY orientations, it takes 16 clock cycles to transmit the tile segment 900 to the engines 902, 904, 906, 908 independent of the data width.

Figure 10:
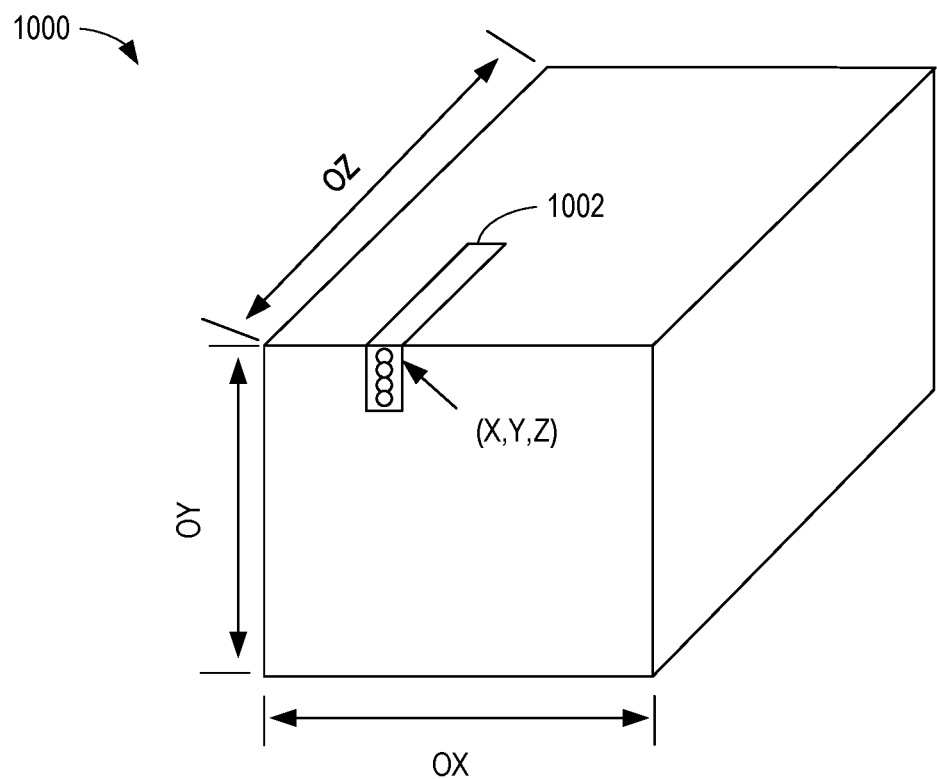
FIG. 10 illustrates an example tensor

FIG. 10 illustrates an example tensor 1000. In examples disclosed herein, the primary values of the tensor 1000 correspond to the dimensions of the tensor 1000. For example, the first primary value OX corresponds to the X dimension of the tensor 1000, the second primary value OY corresponds to the Y dimension of the tensor 1000, and the third primary value OZ corresponds to the Z dimension of the tensor 1000. The example tensor 1000 includes an example tile segment 1002. In some examples, the tile segment 1002 corresponds to the tile segments 110 (FIG. 1). A data point of the tile segment 1002 has coordinates (X, Y, Z). In some examples, the address determining circuitry 310 (FIG. 3) determines secondary values for tensor rotation based on the primary values and coordinates of the data point of the tensor 1000.

Figure 11:
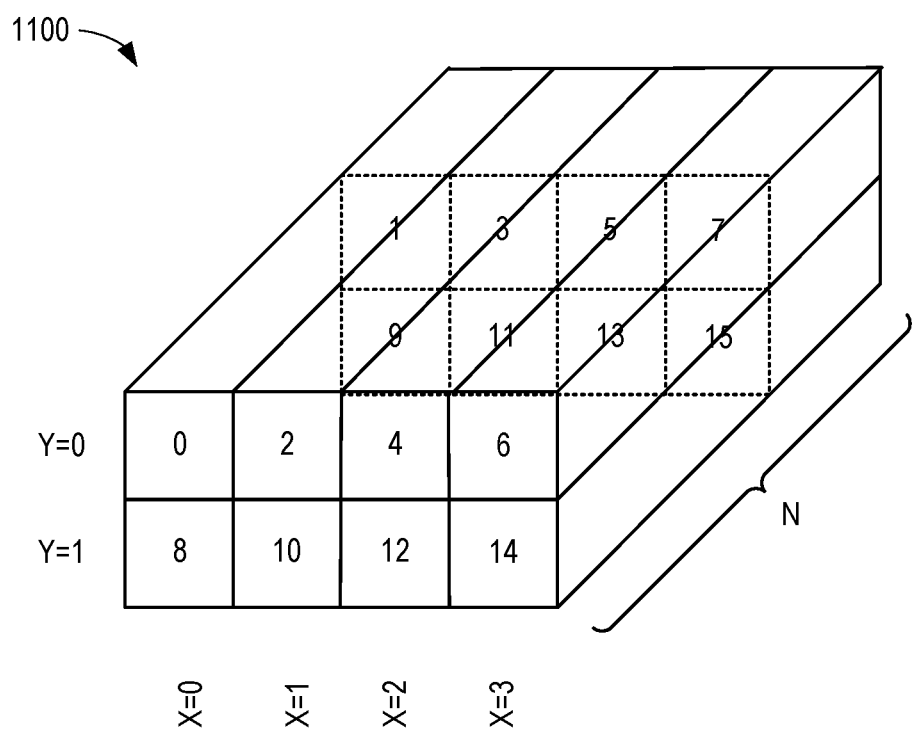
FIG. 11 illustrates example storage elements of a tensor.

FIG. 11 illustrates example storage elements of an example tensor 1100. In some examples, the tensor 1100 is in ZXY format. In the illustrated example of FIG. 11, the tensor 1100 has dimensions X=4 and Y=2. In some examples, the static storage controlling circuitry 314 (FIG. 3) determines to divide the tensor 1100 into storage elements along the Z axis. In the illustrated example of FIG. 11, the static storage controlling circuitry 314 divides the tensor 1100 into two storage elements along the Z axis. The example tensor 1100 is divided into 16 storage elements. The storage elements have a dimension of 1×1×N/2, in which N is the dimension of the tensor 1100 along the Z axis.

Figure 12:
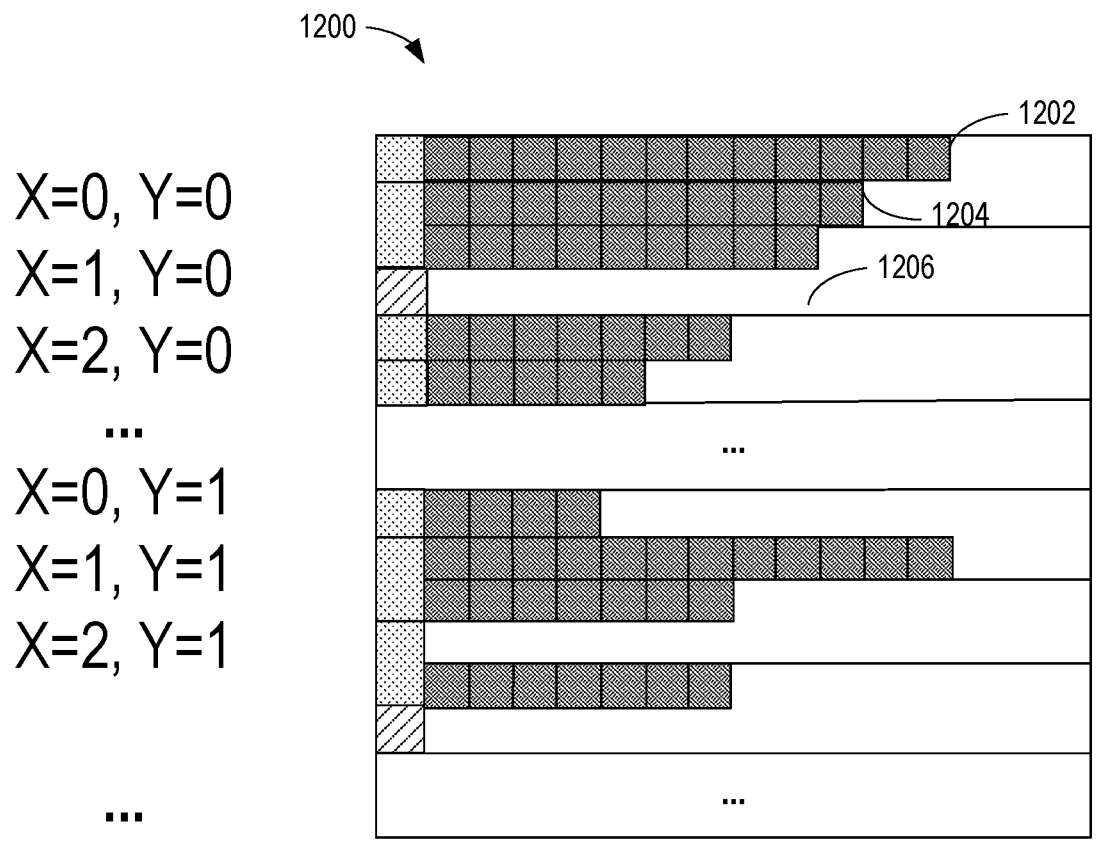
FIG. 12 illustrates example static tensor data stored in example memory.

FIG. 12 illustrates example static tensor data stored in example memory 1200. In some examples, the data stored in the memory 1200 corresponds to the storage elements of the tensor 1100 (FIG. 11). The example static storage controlling circuitry 314 (FIG. 3) compresses the storage elements of FIG. 11 and stores the static tensor in the memory 1200. That is, the static storage controlling circuitry 314 stores the data of the tensor 1100 along the Z axis for XY coordinate pairs. For example, the static tensor stored in the memory 1200 includes an example first row 1202 and an example second row 1204. The example first row 1202 corresponds to the first storage element (e.g., storage element 0 corresponding to X=0, Y=0) and the example second row 1204 corresponds to the second storage element (e.g., storage element 1 corresponding to X=0, Y=0) of FIG. 11. That is, the rows 1202, 1204 correspond to the storage elements of the XY coordinate pair X=0, Y=0. In the illustrated example of FIG. 12, the static storage controlling circuitry 314 compresses the storage elements (e.g., removes data points that are 0). Thus, the storage elements of the memory 1200 are not the same size.

In the illustrated example of FIG. 12, the static storage controlling circuitry 314 stores the storage elements (e.g., the storage elements of FIG. 11) at fixed locations in memory. For example, the shaded boxes in the illustrated example of FIG. 12 correspond to the start addresses of the storage elements. In the illustrated example of FIG. 12, the memory 1200 includes an example third row 1206. The example third row 1206 corresponds to the fourth storage element (e.g., storage element 3) of FIG. 11. In the illustrated example of FIG. 12, the third row 1206 does not store data. Thus, the fourth storage element contains only zeros. However, the static storage controlling circuitry 314 reserves space in the memory 1200 for the fourth storage element.

Figure 13:
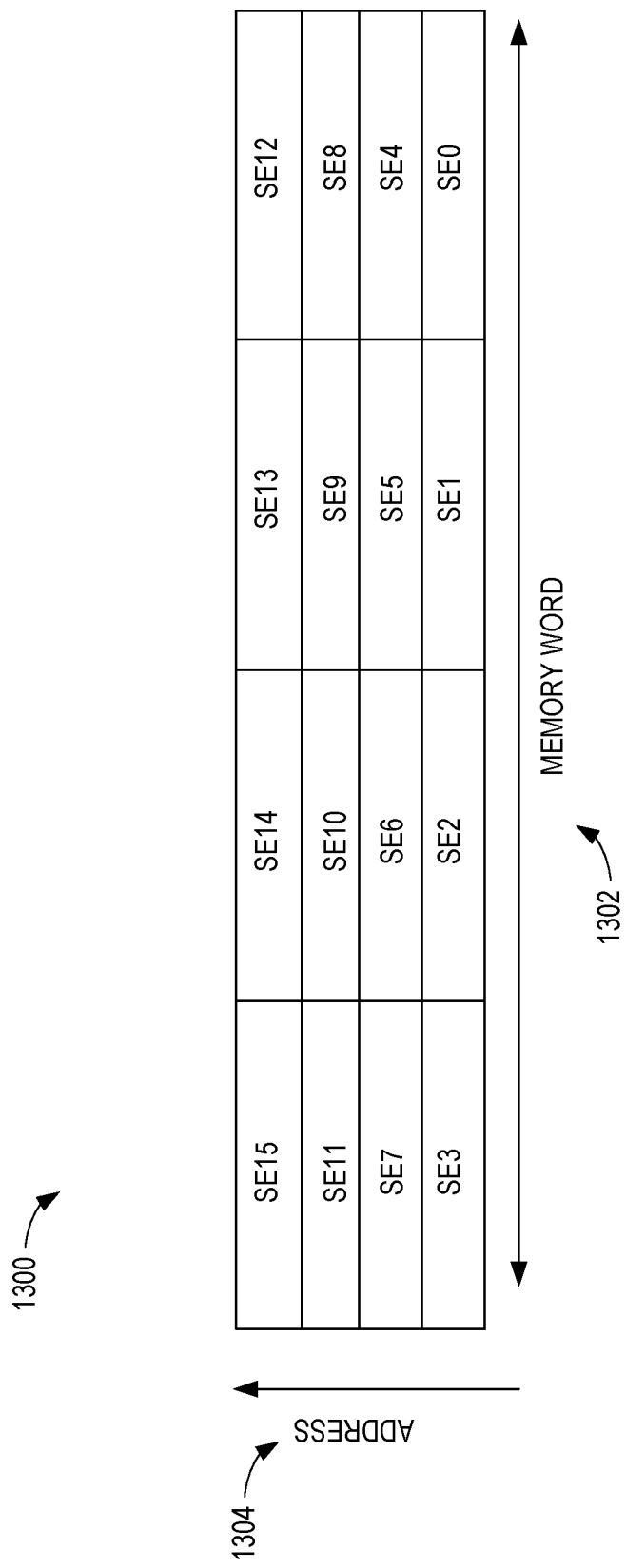
FIG. 13 illustrates an example pointer table.

FIG. 13 illustrates an example pointer table 1300. In some examples, the dynamic storage controlling circuitry 316 (FIG. 3) generates the pointer table 1300. The example pointer table 1300 stores the start location of storage elements in memory. For example, the pointer table 1300 stores the start location of the storage elements of FIG. 11. The example pointer table 1300 includes example memory words 1302 and example addresses 1304. In some examples, the memory words 1302 are associated with four storage elements. For example, one memory word is associated with the storage element 0, the storage element 1, the storage element 2, and the storage element 3. However, in some examples, the dynamic storage controlling circuitry 316 determines the pointers of the pointer table 1300 have a different width. In some examples, the dynamic storage controlling circuitry 316 stores an indication that the storage element is empty (e.g., the storage element includes only zeros).

Figure 14:
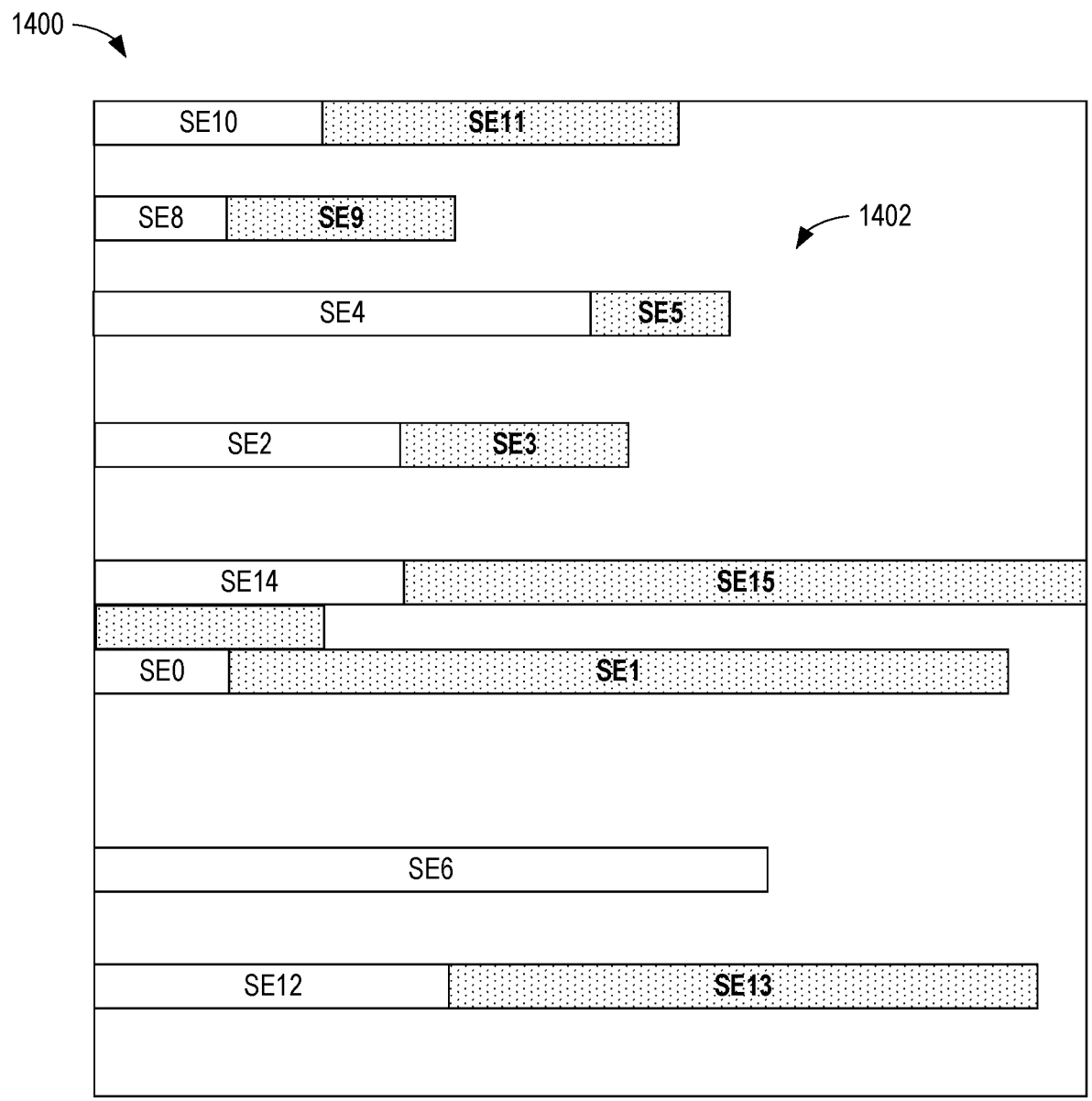
FIG. 14 illustrates example dynamic tensor data stored in example memory.

FIG. 14 illustrates example dynamic tensor data stored in example memory 1400. In some examples, the dynamic storage controlling circuitry 316 (FIG. 3) stores example storage elements 1402 in the memory 1400. In the illustrated example of FIG. 14, the memory 1400 stores 15 storage elements (e.g., SE0, SE1, etc.). The example dynamic storage controlling circuitry 316 compresses the memory 1200 (FIG. 12) and generates the pointer table 1300 (FIG. 13) to store the start location of the storage elements. That is, with respect to the memory 1200, the storage elements of FIG. 14 are stored contiguously and can be stored anywhere in the memory 1400. In some examples, the dynamic storage controlling circuitry 316 stores two consecutive storage elements (e.g., SE0 and SE1, SE2 and SE3, etc.) contiguously. However, the dynamic storage controlling circuitry 316 can store the storage elements in any location in memory (e.g., SE0 and SE3 are stored contiguously, SE0, SE2, and SE3 are stored contiguously, etc.). Thus, the dynamic storage controlling circuitry 316 stores the storage elements in a memory footprint (e.g., the memory 1400) that is relatively smaller than the memory footprint of the memory 1200 corresponding to static tensor data. For example, the dynamic storage controlling circuitry 316 does not store and/or reserve space in memory for storage elements that include only zeros. For example, the storage element 7 is not stored in the memory 1400.

Figure 15:
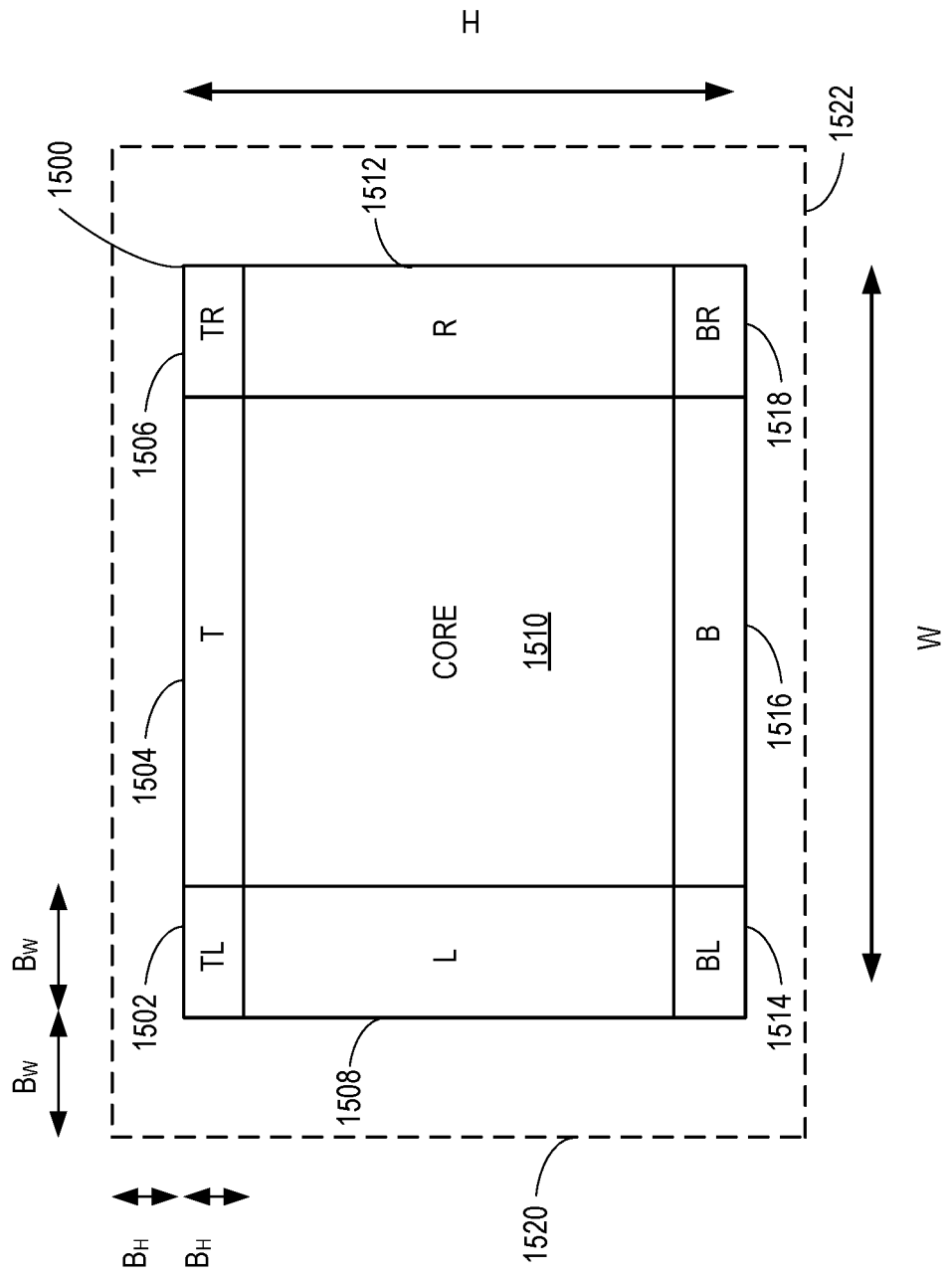
FIG. 15 illustrates an example tensor workload.

FIG. 15 illustrates an example tensor workload 1500. For example, the tensor workload 1500 includes data a compute unit accesses and/or generates. The example tensor workload 1500 has a width (W) and a height (H). In the illustrated example of FIG. 15, the tensor workload 1500 is two dimensional (e.g., a workload in the XY plane). However, in some examples, the tensor workload 1500 is three dimensional. In such examples, the tensor workload 1500 has a depth (D). In the illustrated example of FIG. 15, the workload 1500 is divided into nine regions. For example, the tensor workload 1500 includes an example top left region 1502, an example top region 1504, an example top right region 1506, an example left region 1508, an example core region 1510, an example right region 1512, an example bottom left region 1514, an example bottom region 1516, and an example bottom right region 1518.

The example regions 1502, 1504, 1506, 1508, 1512, 1514, 1516, 1518 are the border region of the tensor workload 1500. The border region of the tensor workload 1500 has a border width ($B_W$) and a border height ($B_H$). For example, the width of the regions 1502, 1506, 1508, 1512, 1514, 1518 is $B_W$. Similarly, the height of the example regions 1502, 1504, 1506, 1514, 1516, 1518 is $B_H$. In the illustrated example of FIG. 15, the tensor workload 1500 is padded. For example, the data handling circuitry 308 (FIG. 3) generates an example padded tensor workload 1520. The example padded tensor workload 1520 includes the tensor workload 1500 and an example padded region 1522. For example, the data handling circuitry 308 pads the tensor workload 1500 by $B_W$ and $B_H$. Thus, the example padded tensor workload 1520 has dimensions W+2$B_W$×H+2$B_H$.

Figure 16:
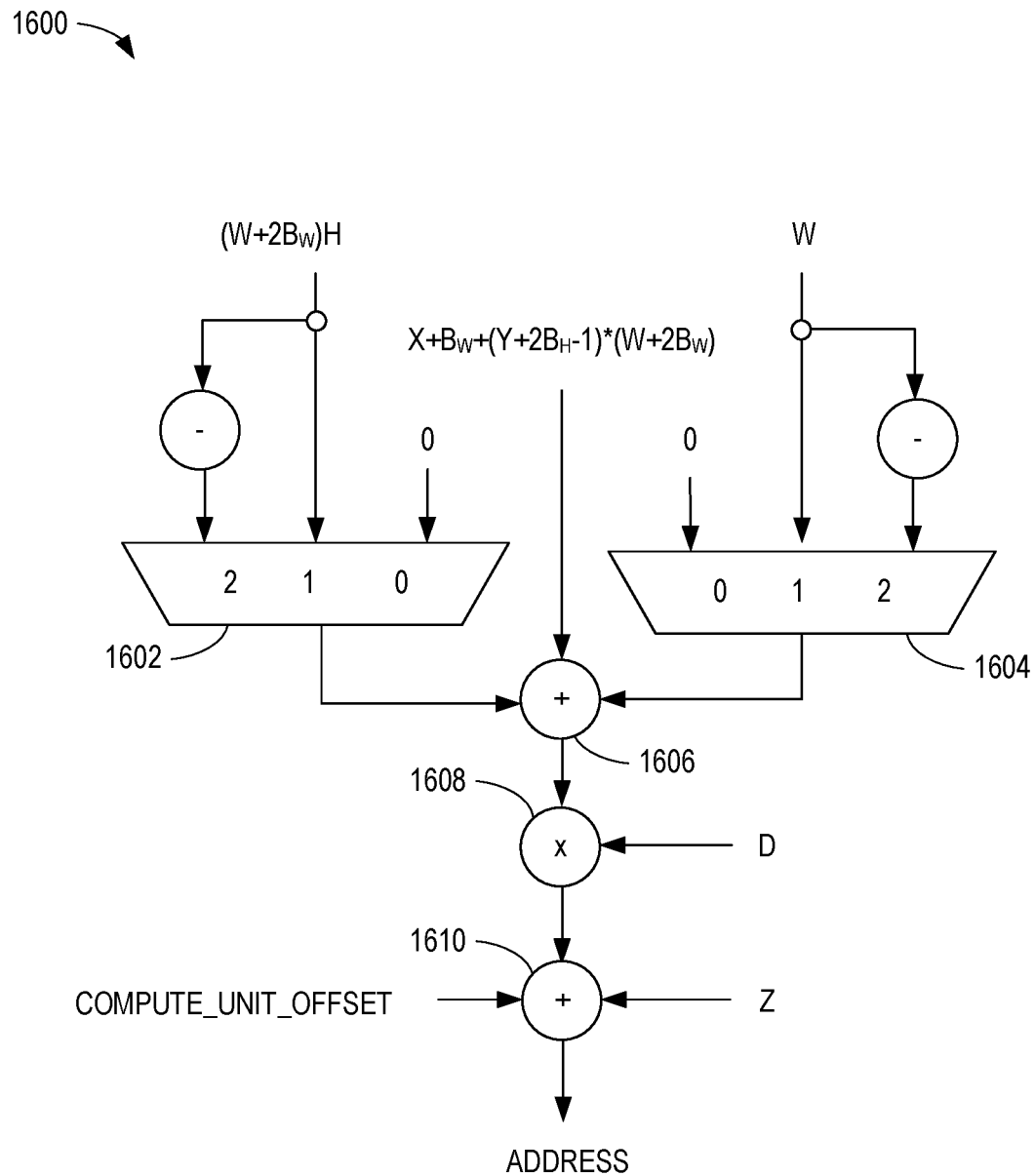
FIG. 16 illustrates an example address calculation architecture.

FIG. 16 illustrates an example address calculation architecture 1600. In some examples, the address translating circuitry 320 (FIG. 3) determines a target address of a different compute unit to transmit a data point to based on the address calculation architecture 1600. The address calculation architecture 1600 includes an example first multiplexer 1602 and an example second multiplexer 1604. The multiplexers 1602, 1604 select one of three input signals (e.g., 0, 1, or 2). The first input signals (e.g., 0) of the multiplexers 1602, 1604 correspond to a value of 0. The second input signal (e.g., 1) of the first multiplexer 1602 corresponds to a value of (W+2$B_W$)H. The third input signal (e.g., 2) of the first multiplexer 1602 corresponds to a value of −(W+2$B_W$)H. The second input signal (e.g., 1) of the second multiplexer 1604 corresponds to a value of W. The third input signal (e.g., 2) of the second multiplexer 1604 corresponds to a value of −W. The variables W, H, $B_W$, and $B_H$ correspond to the dimensions of the tensor workload 1500 (FIG. 15). The example address translating circuitry 320 selects the input signal based on the region the data point is located in. The example address translating circuitry 320 selects the input signal based on example Table 18.

TABLE 18

| Region | First Multiplexer 1602 | Second Multiplexer 1604 |
|---|---|---|
| Core | 0 | 0 |
| TL | 1 | 1 |
| T | 1 | 0 |
| TR | 1 | 2 |
| L | 0 | 1 |
| R | 0 | 2 |
| BL | 2 | 1 |
| B | 2 | 0 |
| BR | 2 | 2 |

For example, the memory location determining circuitry 318 determines a data point is in the top left region (e.g., the top left region 1502 of FIG. 15) based on Tables 5,6 described above. Thus, the address translating circuitry 320 selects the second signal (e.g., 1) for the multiplexers 1602, 1604.

In some examples, the data handling circuitry 308 determines to transmit the entire tensor workload (e.g., the tensor workload 1500). Thus, the address translating circuitry 320 selects the input signals of the multiplexers 1602, 1604 corresponding to the core region. That is, the address translating circuitry 320 does not perform address translation for the tensor workload. Additionally or alternatively, the example data handling circuitry 308 determines to transmit the border region (e.g., the regions 1502, 1504, 1506, 1508, 1512, 1514, 1516, 1518) of the tensor workload. In some examples, the target compute unit processes data that is located on the XY plane diagonally to the bottom-right. Thus, the data handling circuitry 308 determines to transmit only the bottom right region (e.g., the bottom right region 1518). The example address translating circuitry 320 selects the input signals of the multiplexers 1602, 1604 corresponding to the bottom right region based on Table 18.

In the illustrated example of FIG. 16, the address calculation architecture 1600 includes an example first summation block 1606. For example, the address translating circuitry 320 adds the value corresponding to the first multiplexer 1602, the value corresponding to the second multiplexer 1604, and $X+B_W+(Y+2B_H-1)*(W+2B_W)$. The example address calculation architecture 1600 includes an example multiplication block 1608. At the example multiplication block 1608, the address translating circuitry 320 multiples the output of the first summation block 1606 with the depth (D) of the tensor workload. The example address calculation architecture 1600 includes an example second summation block 1610. At the example second summation block 1610, the address translating circuitry 320 adds the output of the multiplication block 1608, a compute unit offset (e.g., the difference between the target compute unit and the current compute unit), and Z (e.g., the Z coordinate of the data point) to generate the target address.

Figure 17:
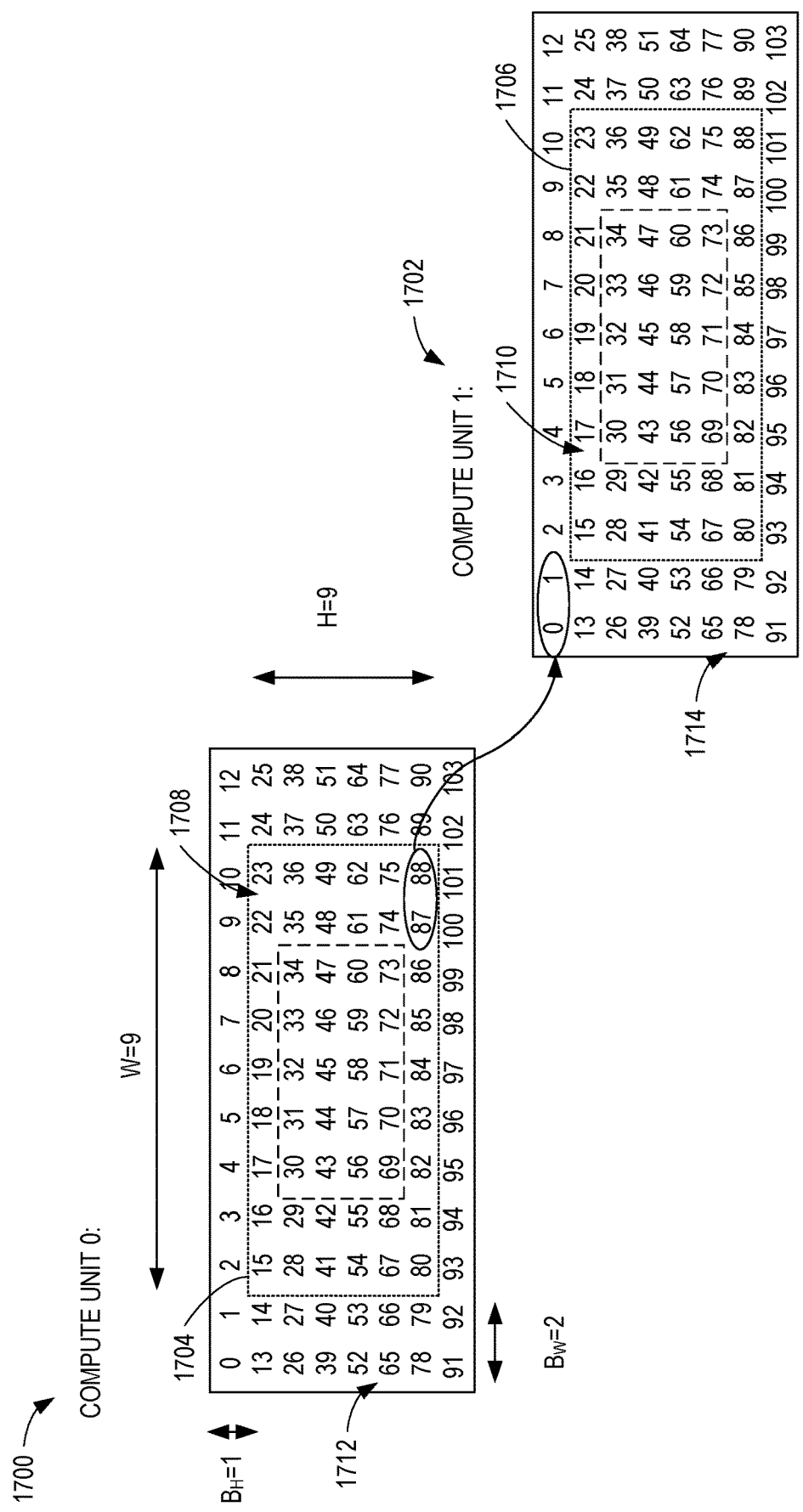
FIG. 17 illustrates an example tensor broadcast from an example first compute unit to an example second compute unit.

FIG. 17 illustrates an example tensor broadcast from an example first compute unit 1700 to an example second compute unit 1702. The example first compute unit 1700 processes an example first tensor workload 1704 and the example second compute unit 1702 processes an example second tensor workload 1706. The example tensor workloads 1704, 1706 have a width of 9 (e.g., W=9), a height of 6 (e.g., H=6), and a depth of 1 (e.g., D=1). In the illustrated example of FIG. 17, the tensor workloads 1704, 1706 are the same size. However, in some examples, the tensor workloads 1704, 1706 have different dimensions. The example first tensor workload 1704 includes an example first border region 1708 and the example second tensor workload 1706 includes an example second border region 1710. The border regions 1708, 1710 have a border width of 2 (e.g., $B_W=2$) and a border height of 1 (e.g., $B_H=1$). In the illustrated example of FIG. 17, the border regions 1708, 1710 are the same size. However, in some examples, the border regions 1708, 1710 have different dimensions. In the illustrated example of FIG. 17, the data handling circuitry 308 (FIG. 3) pads the tensor workloads 1704, 1706 by the border width and the border height. That is, the illustrated example of FIG. 17 includes an example first padded region 1712 corresponding to the first tensor workload 1704 and an example second padded region 1714 corresponding to the second tensor workload 1706. In some examples, the padded regions 1712, 1714 correspond to tensor workloads of adjacent compute units (not illustrated).

In some examples, the data handling circuitry 308 determines to transmit the data of the bottom right region of the tensor workload 1704. That is, the data handling circuitry 308 determines to transmit the data stored in the addresses 87 and 88. Thus, based on example Table 18, the example address translating circuitry 320 (FIG. 3) determines to select the input signal corresponding to the third signal (e.g., 2) of the multiplexers 1602, 1604 (FIG. 16). The example address translating circuitry 320 determines the address of the second compute unit 1702 to transmit the data of address 87 (e.g., X=7, Y=5, Z=0) to based on example Equation 3.

$$ADR(87)=-(W+2B_W)H+(X+B_W+(Y+2B_H-1)(W+2B_3))-W \quad \text{Equation 3}$$

The example address translating circuitry 320 determines the target address is 0 (e.g., ADR(87)=−(9+2*2)6+(7+2+(5+2*1−1)(9+2*2))−9=0). Thus, the example bottom right region of the first tensor workload 1704 (e.g., addresses 87 and 88) are transmitted to the padded region 1714 (e.g., addresses 0 and 1) of the second tensor workload 1706. In some examples, the second compute unit 1702 accesses the replicated data stored in addresses 0 and 1.

In some examples, the post-processing circuitry 106 includes means for rotating tensors. For example, the means for rotating tensors may be implemented by the rotation controlling circuitry 302. In some examples, the rotation controlling circuitry 302 may be implemented by machine executable instructions such as that implemented by at least blocks 1806, 1808 of FIG. 18, 2002 of FIG. 20 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the rotation controlling circuitry 302 is implemented by other hardware logic circuitry, hardware implemented state machines, and/or any other combination of hardware, software, and/or firmware. For example, the rotation controlling circuitry 302 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for determining addresses. For example, the means for determining addresses may be implemented by the address determining circuitry 310. In some examples, the address determining circuitry 310 may be implemented by machine executable instructions such as that implemented by at least block 2004, 2006, 2008 of FIG. 20 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the address determining circuitry 310 is implemented by other hardware logic circuitry, hardware implemented state machines, and/or any other combination of hardware, software, and/or firmware. For example, the address determining circuitry 310 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for compressing tensors. For example, the means for compressing tensors may be implemented by the compressor 304. In some examples, the compressor 304 may be implemented by machine executable instructions such as that implemented by at least block 1810 of FIG. 18 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the compressor 304 is implemented by other hardware logic circuitry, hardware implemented state machines, and/or any other combination of hardware, software, and/or firmware. For example, the compressor 304 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for generating a sparsity map. For example, the means for generating a sparsity map may be implemented by the sparsity map generating circuitry 312. In some examples, the sparsity map generating circuitry 312 may be implemented by machine executable instructions such as that implemented by at least block 2102 of FIG. 21 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the sparsity map generating circuitry 312 is implemented by other hardware logic circuitry, hardware implemented state machines, and/or any other combination of hardware, software, and/or firmware. For example, the sparsity map generating circuitry 312 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means generating static tensors. For example, the means for generating static tensors may be implemented by the static storage controlling circuitry 314. In some examples, the static storage controlling circuitry 314 may be implemented by machine executable instructions such as that implemented by at least blocks 2104, 2106 of FIG. 21 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the static storage controlling circuitry 314 is implemented by other hardware logic circuitry, hardware implemented state machines, and/or any other combination of hardware, software, and/or firmware. For example, the static storage controlling circuitry 314 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for generating dynamic tensors. For example, the means for generating dynamic tensors may be implemented by the dynamic storage controlling circuitry 316. In some examples, the dynamic storage controlling circuitry 316 may be implemented by machine executable instructions such as that implemented by at least blocks 2108, 2110 of FIG. 21 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the dynamic storage controlling circuitry 316 is implemented by other hardware logic circuitry, hardware implemented state machines, and/or any other combination of hardware, software, and/or firmware. For example, the dynamic storage controlling circuitry 316 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for broadcasting tensors. For example, the means for broadcasting tensors may be implemented by the data handling circuitry 308. In some examples, the data handling circuitry 308 may be implemented by machine executable instructions such as that implemented by at least blocks 1812, 1814, 1816 of FIG. 18, 2202, 2208, 2210 of FIG. 22 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the data handling circuitry 308 is implemented by other hardware logic circuitry, hardware implemented state machines, and/or any other combination of hardware, software, and/or firmware. For example, the data handling circuitry 308 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for determining data point locations. For example, the means for determining data point locations may be implemented by the memory location determining circuitry 318. In some examples, the memory location determining circuitry 318 may be implemented by machine executable instructions such as that implemented by at least block 2204 of FIG. 22 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the memory location determining circuitry 318 is implemented by other hardware logic circuitry, hardware implemented state machines, and/or any other combination of hardware, software, and/or firmware. For example, the memory location determining circuitry 318 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the post-processing circuitry 106 includes means for translating addresses. For example, the means for translating addresses may be implemented by the address translating circuitry 320. In some examples, the address translating circuitry 320 may be implemented by machine executable instructions such as that implemented by at least block 2206 of FIG. 22 executed by processor circuitry, which may be implemented by the example processor circuitry 2312 of FIG. 23, the example processor circuitry 2400 of FIG. 24, and/or the example Field Programmable Gate Array (FPGA) circuitry 2500 of FIG. 25. In other examples, the address translating circuitry 320 is implemented by other hardware logic circuitry, hardware implemented state machines, and/or any other combination of hardware, software, and/or firmware. For example, the address translating circuitry 320 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

While an example manner of implementing the post-processing circuitry 106 of FIG. 1 is illustrated in FIG. 3, one or more of the elements, processes, and/or devices illustrated in FIG. 3 may be combined, divided, re-arranged, omitted, eliminated, and/or implemented in any other way. Further, the example rotation controlling circuitry 302, the example compressor 304, the example scratchpad 306, the example data handling circuitry 308, the example address determining circuitry 310, the example sparsity map generating circuitry 312, the example static storage controlling circuitry 314, the example dynamic storage controlling circuitry 316, the example memory location determining circuitry 318, the example address translating circuitry 320, and/or, more generally, the example post-processing circuitry 106 of FIG. 3, may be implemented by hardware, software, firmware, and/or any combination of hardware, software, and/or firmware. Thus, for example, any of the example rotation controlling circuitry 302, the example compressor 304, the example scratchpad memory 306, the example data handling circuitry 308, the example address determining circuitry 310, the example sparsity map generating circuitry 312, the example static storage controlling circuitry 314, the example dynamic storage controlling circuitry 316, the example memory location determining circuitry 318, the example address translating circuitry 320, and/or, more generally, the example post-processing circuitry 106, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). When reading any of the apparatus or system claims of this patent to cover a purely software and/or firmware implementation, at least one of the example rotation controlling circuitry 302, the example compressor 304, the example scratchpad memory 306, the example data handling circuitry 308, the example address determining circuitry 310, the example sparsity map generating circuitry 312, the example static storage controlling circuitry 314, the example dynamic storage controlling circuitry 316, the example memory location determining circuitry 318, and/or the example address translating circuitry 320 is/are hereby expressly defined to include a non-transitory computer readable storage device or storage disk such as a memory, a digital versatile disk (DVD), a compact disk (CD), a Blu-ray disk, etc., including the software and/or firmware. Further still, the example post-processing circuitry 106 of FIG. 1 may include one or more elements, processes, and/or devices in addition to, or instead of, those illustrated in FIG. 3, and/or may include more than one of any or all of the illustrated elements, processes and devices.

Flowcharts representative of example hardware logic circuitry, machine readable instructions, hardware implemented state machines, and/or any combination thereof for implementing the post-processing circuitry 106 of FIGS. 1 and/or 3 are shown in FIGS. 18-22. The machine readable instructions may be one or more executable programs or portion(s) of an executable program for execution by processor circuitry, such as the processor circuitry 2412 shown in the example processor platform 2400 discussed below in connection with FIG. 24 and/or the example processor circuitry discussed below in connection with FIGS. 25 and/or 26. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 18-22, many other methods of implementing the example post-processing circuitry 106 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 18-22 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 18:
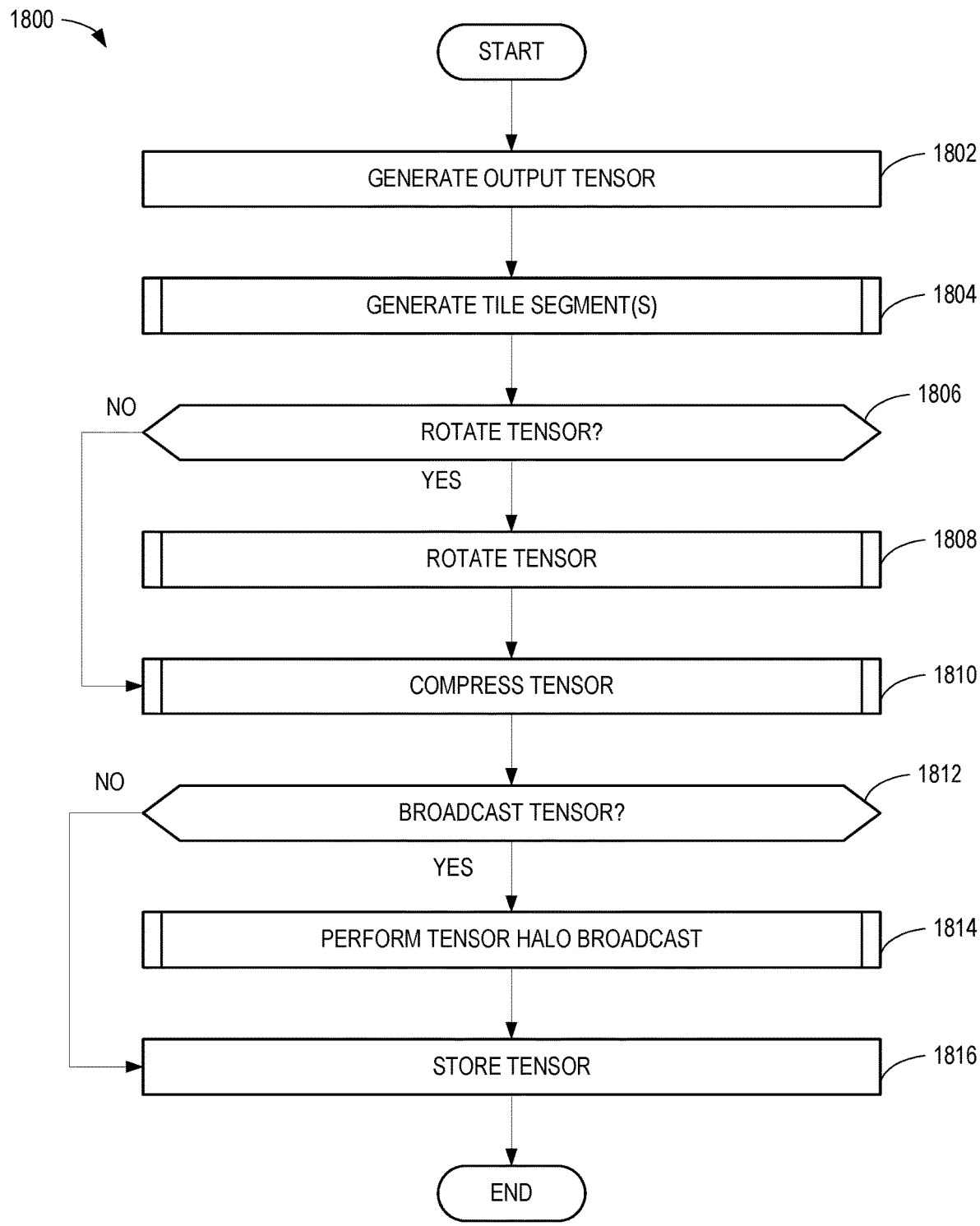
FIG. 18 is a flowchart representative of machine-readable instructions that may be executed by example processor circuitry to implement an example neural network accelerator of FIG. 1 to store tensors.

FIG. 18 is a flowchart representative of machine-readable instructions which may be executed to implement the example NN accelerator 102 of FIG. 1 to store tensors. The example process 1800 begins when the example NN controlling circuitry 104 (FIG. 1) generates an output tensor (block 1802). For example, the NN controlling circuitry 104 accesses data stored in the local memory 108 (FIG. 1). In some examples, the NN controlling circuitry 104 implements a convolutional neural network to generate output tensors.

The example NN controlling circuitry 104 generates tile segment(s) (block 1804). For example, the NN controlling circuitry 104 traverses the output tensor to generate the tile segments 110 (FIG. 1). In some examples, the NN controlling circuitry 104 determines a NTHW mode to traverse the output tensor to generate the tile segments. For example, the NN controlling circuitry 104 selects NTHW=4, 8, or 16. An example implementation of the tile segment generation process 1804 of FIG. 18 is described in further detail in connection with FIG. 19.

The example post-processing circuitry 106 obtains the tile segment(s). The rotation controlling circuitry 302 (FIG. 3) determines whether to rotate the tensor (block 1806). For example, the rotation controlling circuitry 302 determines the orientation of the tile segment(s) and determines a target orientation of the tensor. For example, the tensor orientation can be XYZ, XZY, YXZ, YZX, ZXY, or ZYX. In some examples, the rotation controlling circuitry 302 determines to not rotate the tensor if the current orientation is the same as the target orientation. If the example rotation controlling circuitry 302 determines to rotate the tensor, the rotation controlling circuitry 302 rotates the tensor (block 1808). For example, the rotation controlling circuitry 302 permutes the axes of the tensor to generate a rotated tensor. An example implementation of the tensor rotation process 1808 of FIG. 18 is described in further detail in connection with FIG. 20.

Returning to block 1806, if the example rotation controlling circuitry 302 determines to not rotate the tensor, the example compressor 304 (FIG. 3) compresses the tensor (block 1810). For example, the compressor 304 compresses the tensor to store the tensor in a static format. Additionally or alternatively, the compressor 304 compresses the tensor stored in the static format to store the tensor in a dynamic format. An example implementation of the tensor compression process 1810 of FIG. 18 is described in further detail in connection with FIG. 21.

The example data handling circuitry 308 (FIG. 3) determines whether to broadcast the tensor (block 1812). For example, the data handling circuitry 308 determines whether to transmit data of the tensor to other compute units. If the data handling circuitry 308 determines to broadcast the tensor, the data handling circuitry 308 performs tensor halo broadcast (block 1814). For example, the data handling circuitry 308 determines data to transmit to other compute units. The data handling circuitry 308 determines the address of the target compute unit to transmit the data to based on the location of the data in the tensor workload (e.g., top left region, top region, etc.). An example implementation of the tensor halo broadcast process 1814 of FIG. 18 is described in further detail in connection with FIG. 22.

Returning to block 1812, if the example data handling circuitry 308 determines to not broadcast the tensor, the data handling circuitry 308 stores the tensor (block 1816). For example, the data handling circuitry 308 stores the tensor in the local memory 108 (FIG. 1). In some examples, the tensor is stored in the local memory 108 in the dynamic format.

Figure 19:
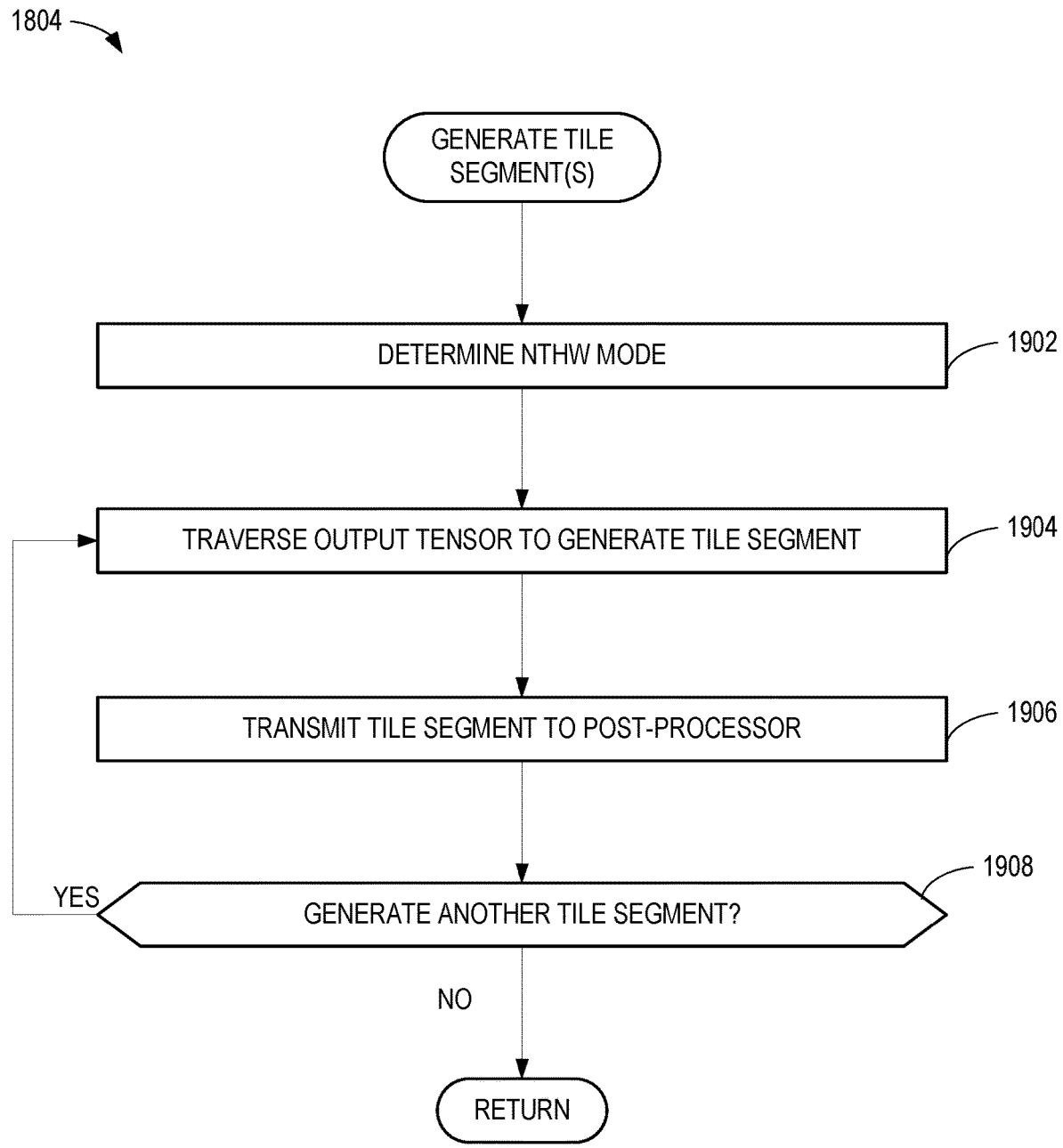
FIG. 19 is a flowchart representative of machine-readable instructions that may be executed by example processor circuitry to implement the example neural network controlling circuitry of FIG. 1 to generate tile segments.

FIG. 19 is a flowchart representative of machine-readable instructions which may be executed to implement the example NN controlling circuitry 104 of FIG. 1 to generate tile segments. The example NN controlling circuitry 104 determines a NTHW mode (block 1902). For example, the NN controlling circuitry 104 determines the NTHW mode is NTHW=4. In some examples, the NN controlling circuitry 104 determines the NTHW mode. In some examples, the NTHW mode is a preconfigured value. For example, the NTHW mode is a configured value determined during compilation, a user input, etc.

The example NN controlling circuitry 104 traverses the output tensor to generate a tile segment (block 1904). The example NN controlling circuitry 104 transmits the tile segment to the post-processing circuitry 106 (block 1906). For example, the NN controlling circuitry 104 traverses the output tensor based on the NTHW mode. For example, if the NTHW mode is NTHW=4, the NN controlling circuitry 104 traverses the output tensor as described above in connection with FIG. 7A. In some examples, the tile segment has dimensions of 1×4×16.

The example NN controlling circuitry 104 determines whether to generate another tile segment (block 1908). For example, the NN controlling circuitry 104 determines whether data in the tensor has not been traversed. If the NN controlling circuitry 104 determines to generate another tile segment, the NN controlling circuitry 104 returns to block 1904. If the NN controlling circuitry 104 determines to not generate another tile segment, the program 1804 returns to block 1806 of FIG. 18.

Figure 20:
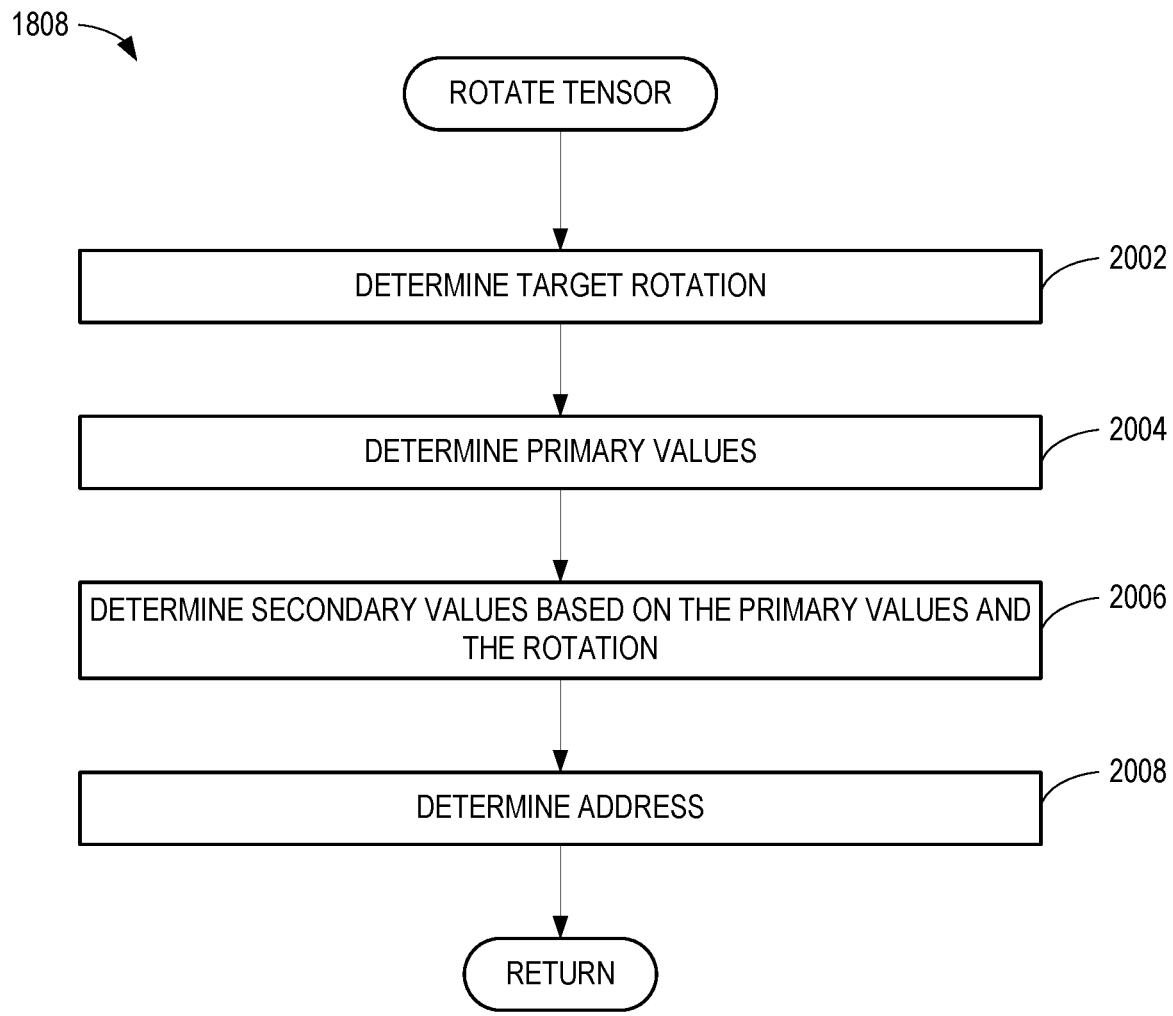
FIG. 20 is a flowchart representative of machine-readable instructions that may be executed by example processor circuitry to implement an example rotation controlling circuitry of FIG. 3 to rotate tensors.

FIG. 20 is a flowchart representative of machine-readable instructions which may be executed to implement the example rotation controlling circuitry 302 of FIG. 3 to rotate tensors. The example rotation controlling circuitry 302 determines a target rotation (block 2002). For example, the rotation controlling circuitry 302 determines the rotation based on a configuration register set by the compiler. In some examples, the compiler sets the configuration register based on subsequent tensor operations.

The example address determining circuitry 310 (FIG. 3) determines primary values of the tensor (block 2004). For example, the address determining circuitry 310 determines the primary values of the tensor OX, OY, and OZ. In examples disclosed herein, the primary values of the tensor correspond to the dimensions of the tensor. The example address determining circuitry 310 determines secondary values of the tensor based on the primary values and the target rotation (block 2006). For example, the address determining circuitry 310 determines the secondary values based on Table 1.

The example address determining circuitry 310 determines a target address (block 2008). For example, the address determining circuitry 310 determines the target address of the data points of the tensor in the target orientation. The example address determining circuitry 310 determines the target address based on Equation 1. That is, the address determining circuitry 310 permutes the axes of the tensor based on the target rotation.

Figure 21:
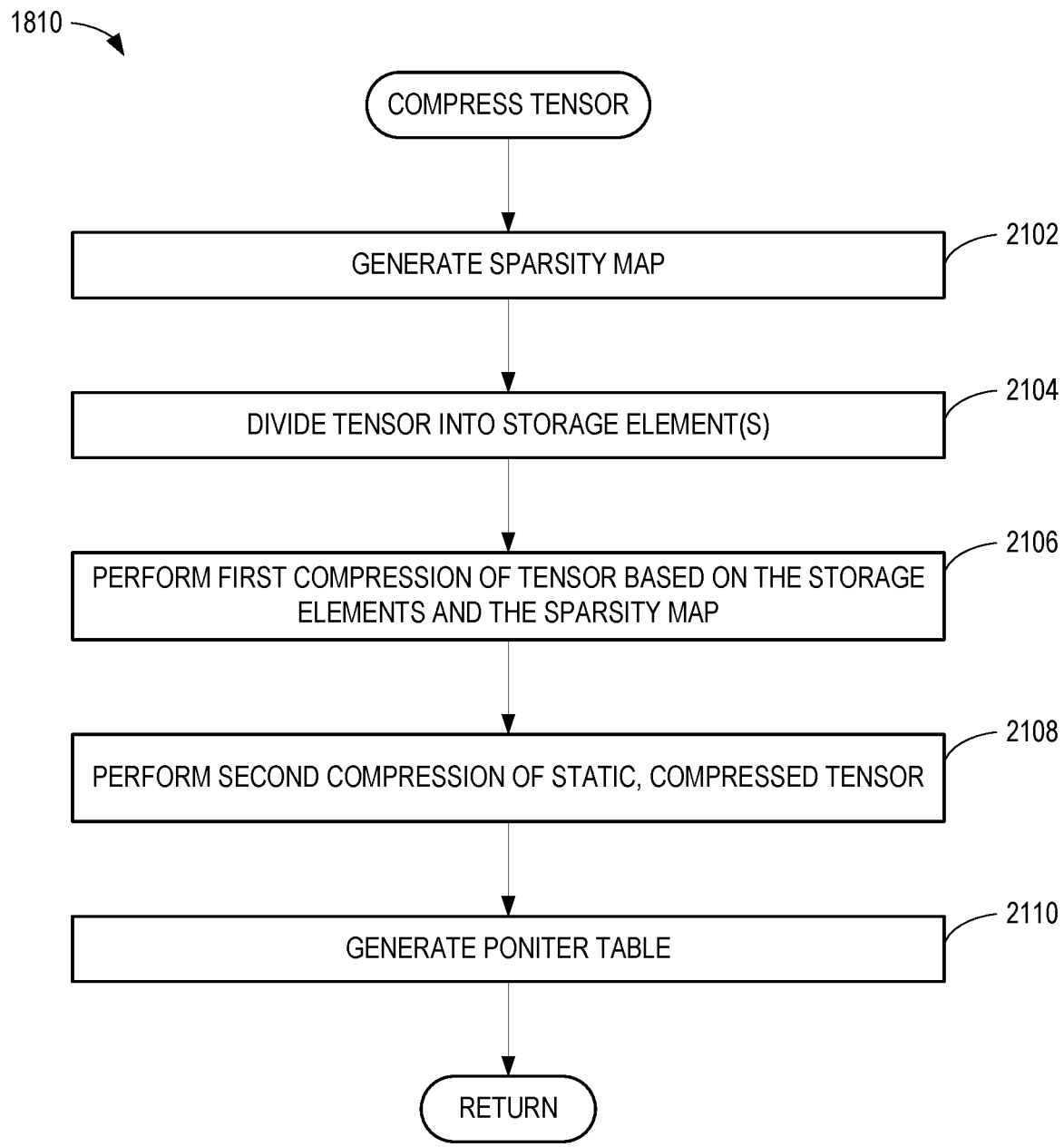
FIG. 21 is a flowchart representative of machine-readable instructions that may be executed by example processor circuitry to implement an example compressor of FIG. 3 to compress tensors.

FIG. 21 is a flowchart representative of machine-readable instructions which may be executed to implement the example compressor 304 of FIG. 3 to compress tensors. The example sparsity map generating circuitry 312 (FIG. 3) generates a sparsity map (block 2102). For example, the sparsity map generating circuitry 312 generates a sparsity map corresponding to the tensor (e.g., the sparsity map illustrated in Table 4). That is, the sparsity map generating circuitry 312 determines whether data points of the tensor are zero.

The example static storage controlling circuitry 314 (FIG. 3) divides the tensor into storage element(s) (block 2104). For example, the static storage controlling circuitry 314 determines an axis to divide the tensor along. In some examples, the static storage controlling circuitry 314 determines how to divide the tensor (e.g., along the X, Y, or Z axis, how many storage elements to generate, etc.) based on a configuration set by the compiler. For example, the static storage controlling circuitry 314 determines to divide a tensor into two storage elements along the Z axis.

The example static storage controlling circuitry 314 performs a first compression of the tensor based on the storage elements and the sparsity map (block 2106). For example, the static storage controlling circuitry 314 removes the zeros from the storage elements based on the sparsity map. That is, the static storage controlling circuitry 314 generates a static, compressed tensor (e.g., the data stored in the memory 1200 of FIG. 12). In examples disclosed herein, the static storage controlling circuitry 314 does not store storage elements that only include zeros.

The example dynamic storage controlling circuitry 316 (FIG. 3) performs a second compression of the static, compressed tensor (block 2108). For example, the dynamic storage controlling circuitry 316 moves the start addresses of the storage elements in memory. In some examples, the dynamic storage controlling circuitry 316 stores storage elements contiguously in memory. Thus, the dynamic storage controlling circuitry 316 generates a dynamic, compressed tensor (e.g., the data stored in the example memory 1400 of FIG. 14). In some examples, the dynamic, compressed tensor requires a smaller memory footprint with respect to the static, compressed tensor.

The dynamic storage controlling circuitry 316 generates a pointer table (block 2110). For example, the dynamic storage controlling circuitry 316 stores the start addresses of the storage elements of the dynamic, compressed tensor in the pointer table. For example, the dynamic storage controlling circuitry 316 generates the example pointer table 1300 of FIG. 13. The example pointer table enables access to the data in the storage elements.

Figure 22:
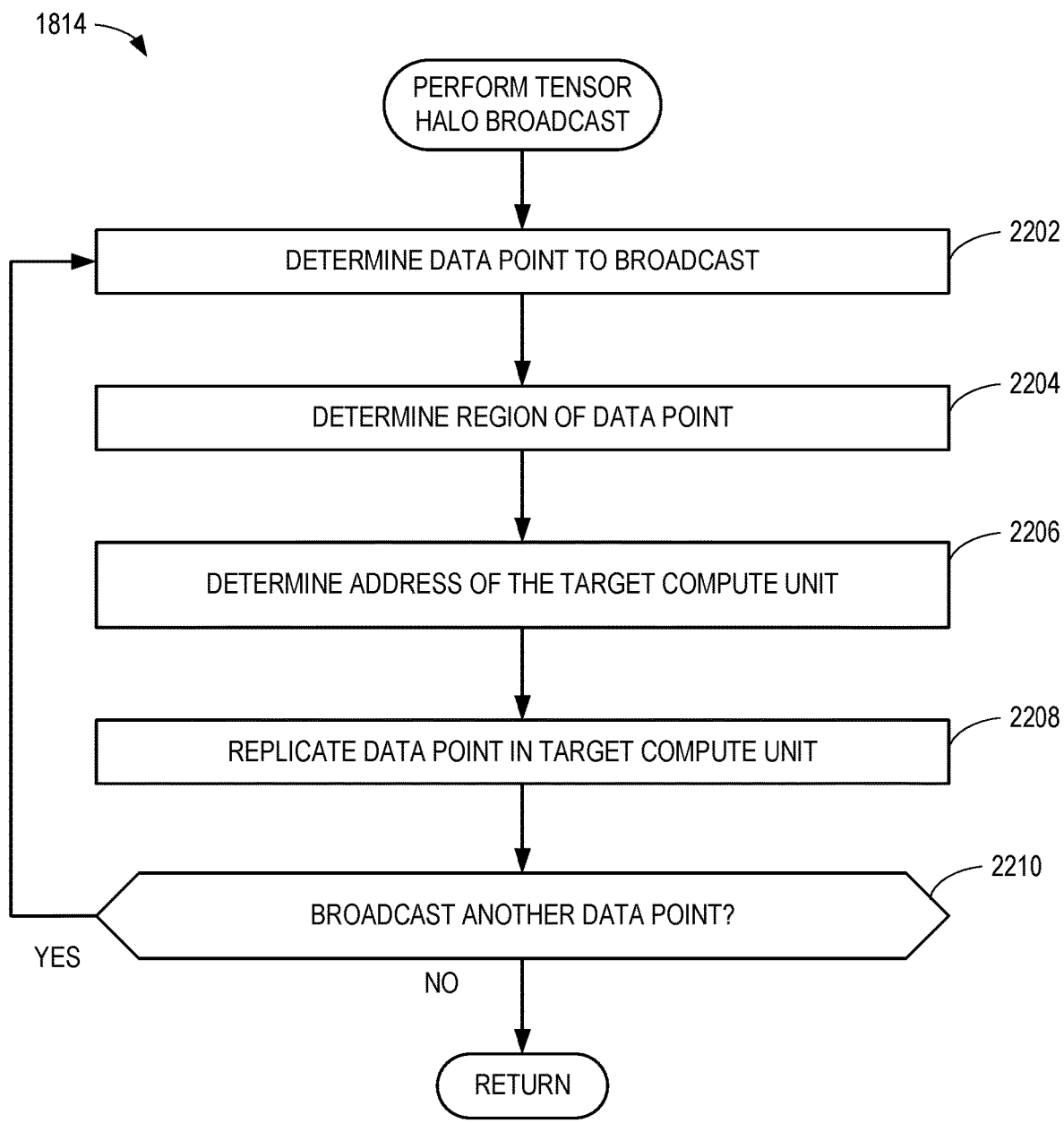
FIG. 22 is a flowchart representative of machine-readable instructions that may be executed by example processor circuitry to implement an example data handling circuitry of FIG. 3 to broadcast tensor halos.

FIG. 22 is a flowchart representative of machine-readable instructions which may be executed to implement the example data handling circuitry 308 of FIG. 3 to broadcast tensor halos. The example data handling circuitry 308 determines a data point to broadcast (block 2202). For example, the data handling circuitry 308 determines the coordinates (e.g., X, Y, Z) of a data point to broadcast to other compute units.

The example memory location determining circuitry 318 (FIG. 3) determines the region of the data point (block 2204). For example, the memory location determining circuitry 318 determines the region the data point is in of the tensor workload. For example, the memory location determining circuitry 318 determines whether the data point is in the top left region, the top region, the top right region, the left region, the core region, the right region, the bottom left region, the bottom region, or the bottom right region.

The example address translating circuitry 320 (FIG. 3) determines the address of the target compute unit (block 2206). For example, the address translating circuitry 320 determines the address of the target compute unit to replicate the data point into. In some examples, the address translating circuitry 320 determines the address based on the example address calculation architecture 1600 if FIG. 16. The example data handling circuitry 308 replicates the data point in the target compute unit (block 2208). For example, the data handling circuitry 308 transmits the data point to the address determined at block 2206 of the target compute unit.

The example data handling circuitry 308 determines whether to broadcast another data point (block 2210). If the data handling circuitry 308 determines to broadcast another data point, the data handling circuitry 308 returns to block 2202. If the data handling circuitry 308 determines to not broadcast another data point, the data handling circuitry 308 returns to block 1816 of FIG. 18.

Figure 23:
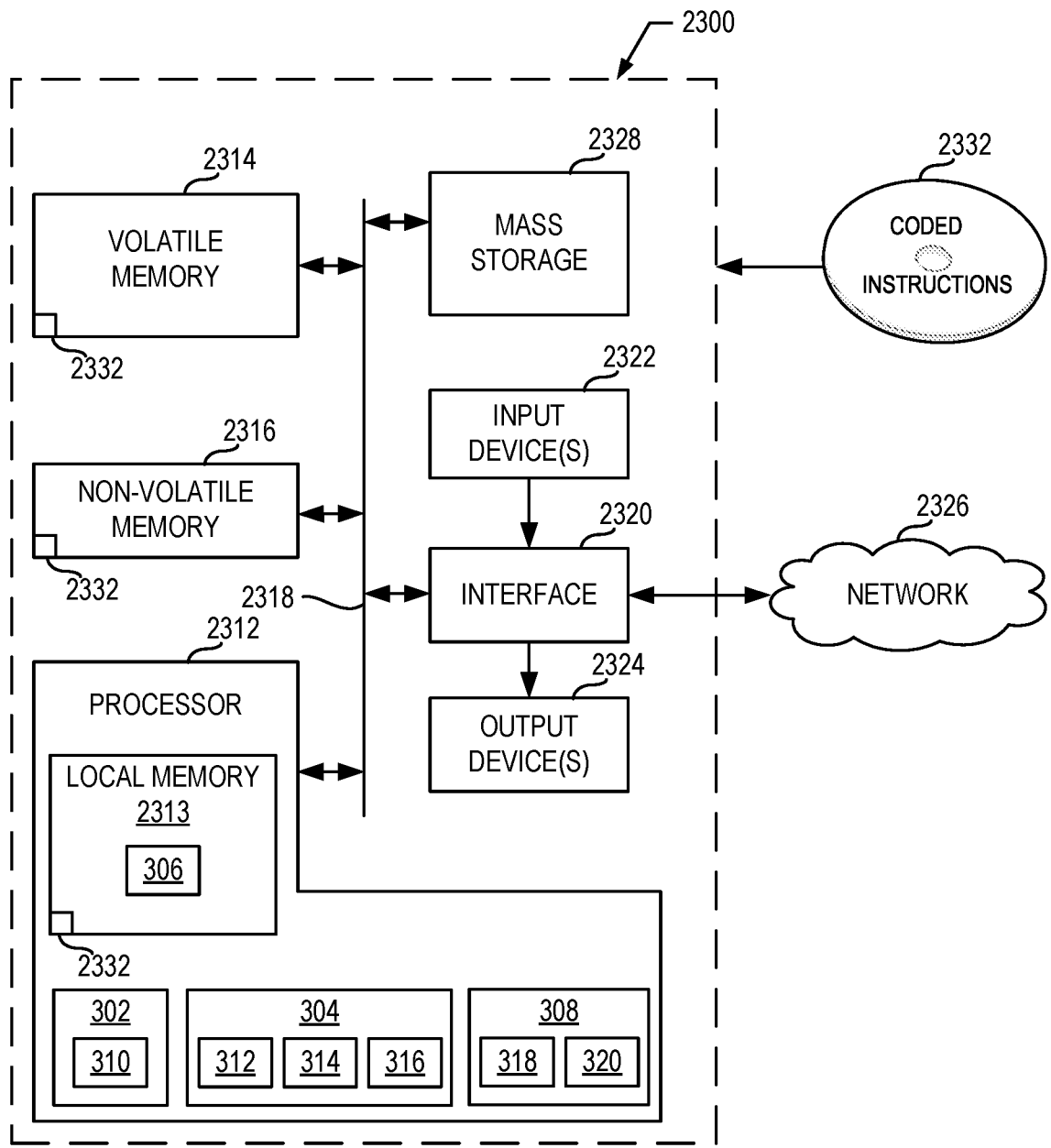
FIG. 23 is a block diagram of an example processing platform structured to execute the instructions of FIGS. 18-22 to implement the example tensor storage system of FIG. 1.

FIG. 23 is a block diagram of an example processor platform 2300 structured to execute and/or instantiate the machine readable instructions and/or operations of FIGS. 18-22 to implement the post-processing circuitry 106 of FIGS. 1 and/or 3. The processor platform 2300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 2300 of the illustrated example includes processor circuitry 2312. The processor circuitry 2312 of the illustrated example is hardware. For example, the processor circuitry 2312 can be implemented by one or more integrated circuits, logic circuits, FPGAs microprocessors, CPUs, GPUs, DSPs, and/or microcontrollers from any desired family or manufacturer. The processor circuitry 2312 may be implemented by one or more semiconductor based (e.g., silicon based) devices. In this example, the processor circuitry 2312 implements the example rotation controlling circuitry 302, the example compressor 304, the example data handling circuitry 308, the example address determining circuitry 310, the example sparsity map generating circuitry 312, the example static storage controlling circuitry 314, the example dynamic storage controlling circuitry 316, the example memory location determining circuitry 318, and the example address translating circuitry 320.

The processor circuitry 2312 of the illustrated example includes a local memory 2313 (e.g., a cache, registers, etc.). The processor circuitry 2312 of the illustrated example is in communication with a main memory including a volatile memory 2314 and a non-volatile memory 2316 by a bus 2318. The volatile memory 2314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2316 may be implemented by flash memory and/or any other desired type of memory device. Access to the main memory 2314, 2316 of the illustrated example is controlled by a memory controller 2317.

The processor platform 2300 of the illustrated example also includes interface circuitry 2320. The interface circuitry 2320 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 2322 are connected to the interface circuitry 2320. The input device(s) 2322 permit(s) a user to enter data and/or commands into the processor circuitry 2312. The input device(s) 2322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 2324 are also connected to the interface circuitry 2320 of the illustrated example. The output devices 2324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2320 of the illustrated example, thus, typically includes a graphics driver card, a graphics driver chip, and/or graphics processor circuitry such as a GPU.

The interface circuitry 2320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2326. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 2300 of the illustrated example also includes one or more mass storage devices 2328 to store software and/or data. Examples of such mass storage devices 2328 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 2332, which may be implemented by the machine readable instructions of FIGS. 18-22, may be stored in the mass storage device 2328, in the volatile memory 2314, in the non-volatile memory 2316, and/or on a removable non-transitory computer readable storage medium such as a CD or DVD.

Figure 24:
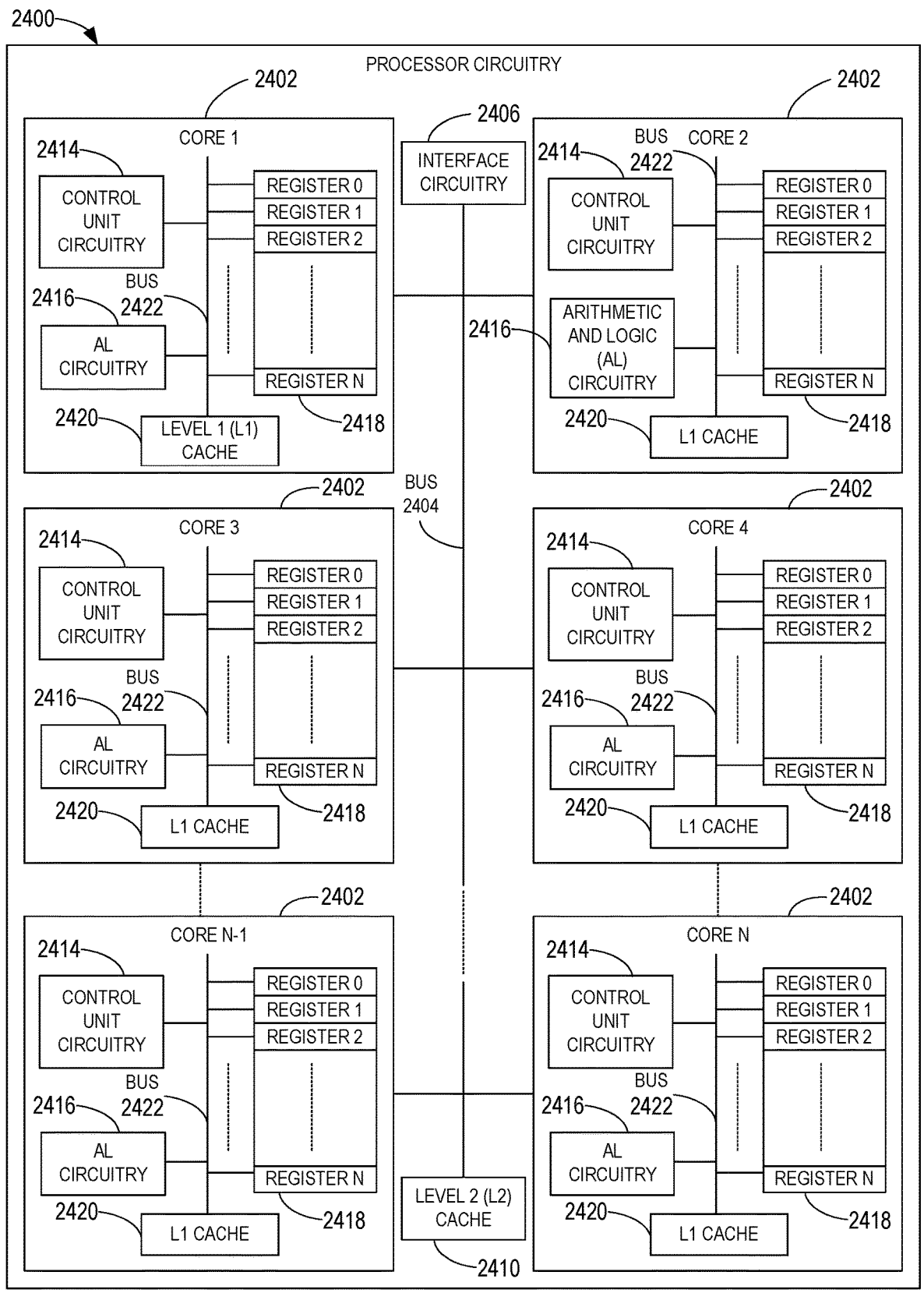
FIG. 24 is a block diagram of an example implementation of the processor circuitry of FIG. 23.

FIG. 24 is a block diagram of an example implementation of the processor circuitry 2312 of FIG. 23. In this example, the processor circuitry 2312 of FIG. 23 is implemented by a microprocessor 2400. For example, the microprocessor 2400 may implement multi-core hardware circuitry such as a CPU, a DSP, a GPU, an XPU, etc. Although it may include any number of example cores 2402 (e.g., 1 core), the microprocessor 2400 of this example is a multi-core semiconductor device including N cores. The cores 2402 of the microprocessor 2400 may operate independently or may cooperate to execute machine readable instructions. For example, machine code corresponding to a firmware program, an embedded software program, or a software program may be executed by one of the cores 2402 or may be executed by multiple ones of the cores 2402 at the same or different times. In some examples, the machine code corresponding to the firmware program, the embedded software program, or the software program is split into threads and executed in parallel by two or more of the cores 2402. The software program may correspond to a portion or all of the machine readable instructions and/or operations represented by the flowchart of FIG. 18-22.

The cores 2402 may communicate by an example bus 2404. In some examples, the bus 2404 may implement a communication bus to effectuate communication associated with one(s) of the cores 2402. For example, the bus 2404 may implement at least one of an Inter-Integrated Circuit (I2C) bus, a Serial Peripheral Interface (SPI) bus, a PCI bus, or a PCIe bus. Additionally or alternatively, the bus 2404 may implement any other type of computing or electrical bus. The cores 2402 may obtain data, instructions, and/or signals from one or more external devices by example interface circuitry 2406. The cores 2402 may output data, instructions, and/or signals to the one or more external devices by the interface circuitry 2406. Although the cores 2402 of this example include example local memory 2420 (e.g., Level 1 (L1) cache that may be split into an L1 data cache and an L1 instruction cache), the microprocessor 2400 also includes example shared memory 2410 that may be shared by the cores (e.g., Level 2 (L2_cache)) for high-speed access to data and/or instructions. Data and/or instructions may be transferred (e.g., shared) by writing to and/or reading from the shared memory 2410. The local memory 2420 of each of the cores 2402 and the shared memory 2410 may be part of a hierarchy of storage devices including multiple levels of cache memory and the main memory (e.g., the main memory 2314, 2316 of FIG. 23). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 2402 may be referred to as a CPU, DSP, GPU, etc., or any other type of hardware circuitry. Each core 2402 includes control unit circuitry 2414, arithmetic and logic (AL) circuitry (sometimes referred to as an ALU) 2416, a plurality of registers 2418, the L1 cache 2420, and an example bus 2422. Other structures may be present. For example, each core 2402 may include vector unit circuitry, single instruction multiple data (SIMD) unit circuitry, load/store unit (LSU) circuitry, branch/jump unit circuitry, floating-point unit (FPU) circuitry, etc. The control unit circuitry 2414 includes semiconductor-based circuits structured to control (e.g., coordinate) data movement within the corresponding core 2402. The AL circuitry 2416 includes semiconductor-based circuits structured to perform one or more mathematic and/or logic operations on the data within the corresponding core 2402. The AL circuitry 2416 of some examples performs integer based operations. In other examples, the AL circuitry 2416 also performs floating point operations. In yet other examples, the AL circuitry 2416 may include first AL circuitry that performs integer based operations and second AL circuitry that performs floating point operations. In some examples, the AL circuitry 2416 may be referred to as an Arithmetic Logic Unit (ALU). The registers 2418 are semiconductor-based structures to store data and/or instructions such as results of one or more of the operations performed by the AL circuitry 2416 of the corresponding core 2402. For example, the registers 2418 may include vector register(s), SIMD register(s), general purpose register(s), flag register(s), segment register(s), machine specific register(s), instruction pointer register(s), control register(s), debug register(s), memory management register(s), machine check register(s), etc. The registers 2418 may be arranged in a bank as shown in FIG. 24. Alternatively, the registers 2418 may be organized in any other arrangement, format, or structure including distributed throughout the core 2402 to shorten access time. The bus 2422 may implement at least one of an I2C bus, a SPI bus, a PCI bus, or a PCIe bus Each core 2402 and/or, more generally, the microprocessor 2400 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 2400 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 25:
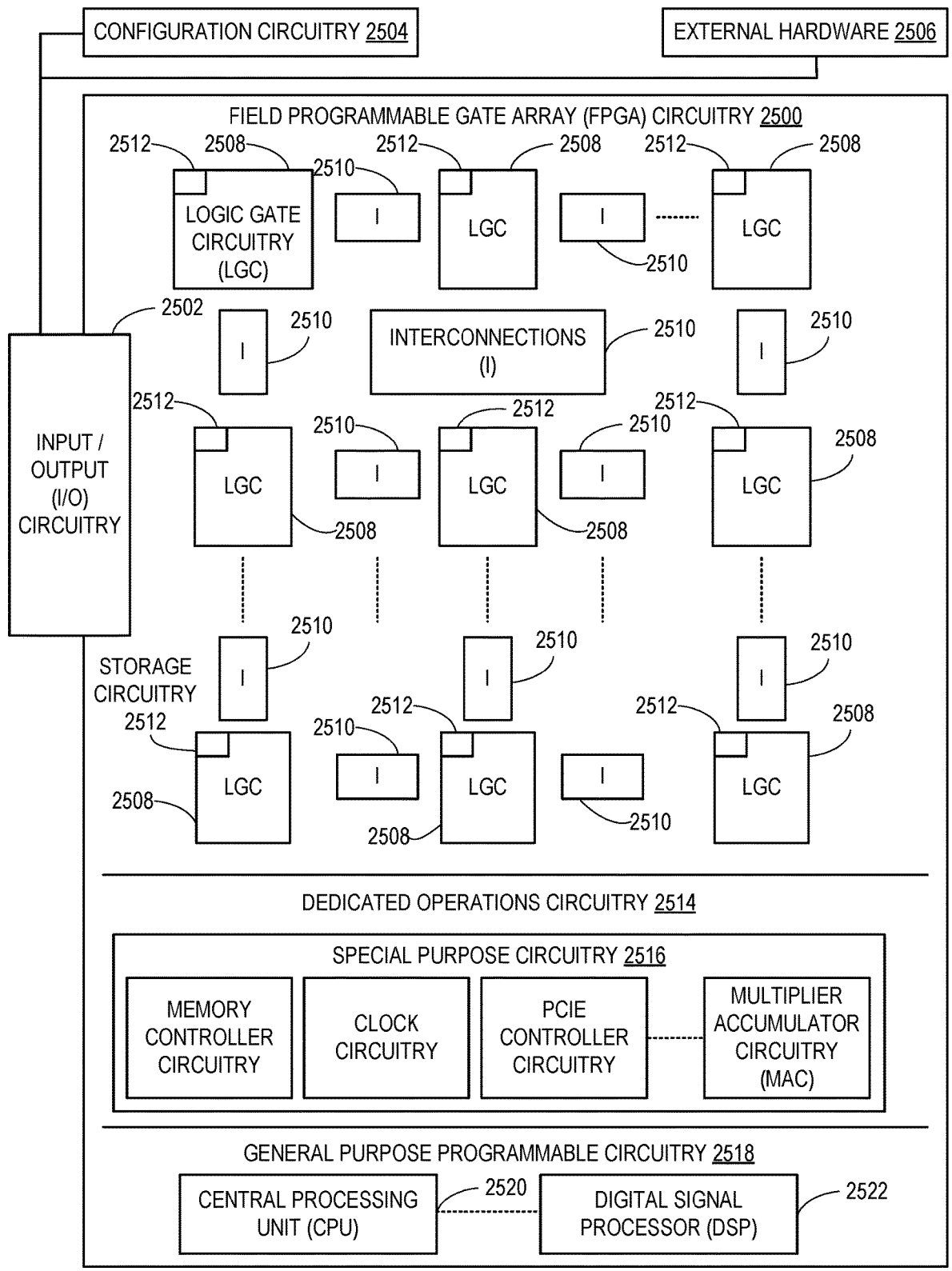
FIG. 25 is a block diagram of another example implementation of the processor circuitry of FIG. 23.

FIG. 25 is a block diagram of another example implementation of the processor circuitry 2312 of FIG. 23. In this example, the processor circuitry 2312 is implemented by FPGA circuitry 2500. The FPGA circuitry 2500 can be used, for example, to perform operations that could otherwise be performed by the example microprocessor 2400 of FIG. 24 executing corresponding machine readable instructions. However, once configured, the FPGA circuitry 2500 instantiates the machine readable instructions in hardware and, thus, can often execute the operations faster than they could be performed by a general purpose microprocessor executing the corresponding software.

More specifically, in contrast to the microprocessor 2400 of FIG. 24 described above (which is a general purpose device that may be programmed to execute some or all of the machine readable instructions represented by the flowcharts of FIGS. 18-22 but whose interconnections and logic circuitry are fixed once fabricated), the FPGA circuitry 2500 of the example of FIG. 25 includes interconnections and logic circuitry that may be configured and/or interconnected in different ways after fabrication to instantiate, for example, some or all of the machine readable instructions represented by the flowcharts of FIGS. 18-22. In particular, the FPGA 2500 may be thought of as an array of logic gates, interconnections, and switches. The switches can be programmed to change how the logic gates are interconnected by the interconnections, effectively forming one or more dedicated logic circuits (unless and until the FPGA circuitry 2500 is reprogrammed). The configured logic circuits enable the logic gates to cooperate in different ways to perform different operations on data received by input circuitry. Those operations may correspond to some or all of the software represented by the flowcharts of FIGS. 18-22. As such, the FPGA circuitry 2500 may be structured to effectively instantiate some or all of the machine readable instructions of the flowcharts of FIGS. 18-22 as dedicated logic circuits to perform the operations corresponding to those software instructions in a dedicated manner analogous to an ASIC. Therefore, the FPGA circuitry 2500 may perform the operations corresponding to the some or all of the machine readable instructions of FIGS. 18-22 faster than the general purpose microprocessor can execute the same.

In the example of FIG. 25, the FPGA circuitry 2500 is structured to be programmed (and/or reprogrammed one or more times) by an end user by a hardware description language (HDL) such as Verilog. The FPGA circuitry 2500 of FIG. 25, includes example input/output (I/O) circuitry 2502 to obtain and/or output data to/from example configuration circuitry 2504 and/or external hardware (e.g., external hardware circuitry) 2506. For example, the configuration circuitry 2504 may implement interface circuitry that may obtain machine readable instructions to configure the FPGA circuitry 2500, or portion(s) thereof. In some such examples, the configuration circuitry 2504 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 2506 may implement the microprocessor 2400 of FIG. 24. The FPGA circuitry 2500 also includes an array of example logic gate circuitry 2508, a plurality of example configurable interconnections 2510, and example storage circuitry 2512. The logic gate circuitry 2508 and interconnections 2510 are configurable to instantiate one or more operations that may correspond to at least some of the machine readable instructions of FIGS. 18-22 and/or other desired operations. The logic gate circuitry 2508 shown in FIG. 25 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 2508 to enable configuration of the electrical structures and/or the logic gates to form circuits to perform desired operations. The logic gate circuitry 2508 may include other electrical structures such as look-up tables (LUTs), registers (e.g., flip-flops or latches), multiplexers, etc.

The interconnections 2510 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 2508 to program desired logic circuits.

The storage circuitry 2512 of the illustrated example is structured to store result(s) of the one or more of the operations performed by corresponding logic gates. The storage circuitry 2512 may be implemented by registers or the like. In the illustrated example, the storage circuitry 2512 is distributed amongst the logic gate circuitry 2508 to facilitate access and increase execution speed.

The example FPGA circuitry 2500 of FIG. 25 also includes example Dedicated Operations Circuitry 2514. In this example, the Dedicated Operations Circuitry 2514 includes special purpose circuitry 2516 that may be invoked to implement commonly used functions to avoid the need to program those functions in the field. Examples of such special purpose circuitry 2516 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 2500 may also include example general purpose programmable circuitry 2518 such as an example CPU 2520 and/or an example DSP 2522. Other general purpose programmable circuitry 2518 may additionally or alternatively be present such as a GPU, an XPU, etc., that can be programmed to perform other operations.

Although FIGS. 24 and 25 illustrate two example implementations of the processor circuitry 2312 of FIG. 23, many other approaches are contemplated. For example, as mentioned above, modern FPGA circuitry may include an on-board CPU, such as one or more of the example CPU 2520 of FIG. 25. Therefore, the processor circuitry 2312 of FIG. 23 may additionally be implemented by combining the example microprocessor 2400 of FIG. 24 and the example FPGA circuitry 2500 of FIG. 25. In some such hybrid examples, a first portion of the machine readable instructions represented by the flowcharts of FIGS. 18-22 may be executed by one or more of the cores 2402 of FIG. 24 and a second portion of the machine readable instructions represented by the flowcharts of FIGS. 18-22 may be executed by the FPGA circuitry 2500 of FIG. 25.

In some examples, the processor circuitry 2312 of FIG. 23 may be in one or more packages. For example, the processor circuitry 2400 of FIG. 24 and/or the FPGA circuitry 2500 of FIG. 25 may be in one or more packages. In some examples, an XPU may be implemented by the processor circuitry 2312 of FIG. 23, which may be in one or more packages. For example, the XPU may include a CPU in one package, a DSP in another package, a GPU in yet another package, and an FPGA in still yet another package.

Figure 26:
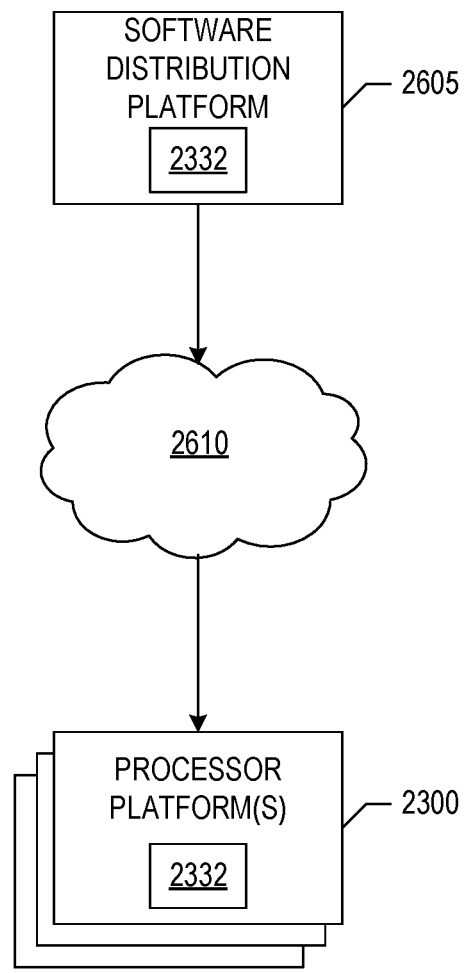
FIG. 26 is a block diagram of an example software distribution platform to distribute software (e.g., software corresponding to the example computer readable instructions of FIGS. 18-22) to client devices such as consumers (e.g., for license, sale and/or use), retailers (e.g., for sale, re-sale, license, and/or sub-license), and/or original equipment manufacturers (OEMs) (e.g., for inclusion in products to be distributed to, for example, retailers and/or to direct buy customers).

A block diagram illustrating an example software distribution platform 2605 to distribute software such as the example computer readable instructions 2332 of FIG. 23 to third parties is illustrated in FIG. 26. The example software distribution platform 2405 may be implemented by any computer server, data facility, cloud service, etc., capable of storing and transmitting software to other computing devices. The third parties may be customers of the entity owning and/or operating the software distribution platform. For example, the entity that owns and/or operates the software distribution platform may be a developer, a seller, and/or a licensor of software such as the example computer readable instructions 2332 of FIG. 23. The third parties may be consumers, users, retailers, OEMs, etc., who purchase and/or license the software for use and/or re-sale and/or sub-licensing. In the illustrated example, the software distribution platform 2605 includes one or more servers and one or more storage devices. The storage devices store the computer readable instructions 2332, which may correspond to the example computer readable instructions of FIGS. 18-22, as described above. The one or more servers of the example software distribution platform 2605 are in communication with a network 2610, which may correspond to any one or more of the Internet and/or any of the example network 2326 described above. In some examples, the one or more servers are responsive to requests to transmit the software to a requesting party as part of a commercial transaction. Payment for the delivery, sale and/or license of the software may be handled by the one or more servers of the software distribution platform and/or via a third party payment entity. The servers enable purchasers and/or licensors to download the computer readable instructions 2332 from the software distribution platform 2605. For example, the software, which may correspond to the example computer readable instructions of FIGS. 18-22, may be downloaded to the example processor platform 2300, which is to execute the computer readable instructions 2332 to implement the example post-processing circuitry 106. In some example, one or more servers of the software distribution platform 2605 periodically offer, transmit, and/or force updates to the software (e.g., the example computer readable instructions 2332 of FIG. 23) to ensure improvements, patches, updates, etc. are distributed and applied to the software at the end user devices.

From the foregoing, it will be appreciated that example methods, apparatus and articles of manufacture have been disclosed for sparse tensor storage for neural network accelerators. For example, methods, apparatus, and articles of manufacture in accordance with the examples set forth herein store tensor data in a dynamic, compressed format. Thus, example methods, apparatus, and articles of manufacture in accordance with the examples set forth herein have smaller memory requirements and decrease the time and power consumption associated with transferring the compressed data (as compared with prior neural network accelerators). Example methods, apparatus, and articles of manufacture perform tensor rotation in the accelerator without the use of (or with reduced usage of) a general-purpose application processor, reducing computing time to read and write data. Example methods, apparatus, and articles of manufacture in accordance with the examples set forth herein improve power requirements and transmission time of data sharing between compute units by broadcasting data stored in the border region of a tensor workload. The disclosed methods, apparatus and articles of manufacture are accordingly directed to one or more improvement(s) in the functioning of a computer.

Example methods, apparatus, systems, and articles of manufacture for sparse tensor storage for neural network accelerators are disclosed herein. Further examples and combinations thereof include the following:

Example 1 includes an apparatus comprising sparsity map generating circuitry to generate a sparsity map corresponding to a tensor, the sparsity map to indicate whether a data point of the tensor is zero, static storage controlling circuitry to divide the tensor into one or more storage elements, and a compressor to perform a first compression of the one or more storage elements to generate one or more compressed storage elements, the first compression to remove zero points of the one or more storage elements based on the sparsity map, and perform a second compression of the one or more compressed storage elements, the second compression to store the one or more compressed storage elements contiguously in memory.

Example 2 includes the apparatus of example 1, wherein a size of the sparsity map is based on a data size of the data point of the tensor.

Example 3 includes the apparatus of example 1, further including dynamic storage controlling circuitry to generate a pointer table, the pointer table storing addresses corresponding to the one or more compressed storage elements of the second compression.

Example 4 includes the apparatus of example 1, further including rotation controlling circuitry to rotate the tensor based on at least one of primary values of the tensor, secondary values of the tensor, a scaling factor, or a data alignment.

Example 5 includes the apparatus of example 1, further including data handling circuitry to broadcast a data point of a workload of the tensor of a first compute unit to at least a second compute unit, the workload having a width, a height, and a depth.

Example 6 includes the apparatus of example 5, further including memory location determining circuitry to determine a location of the data point in the workload.

Example 7 includes the apparatus of example 6, wherein the location is one of a left region, a top left region, a bottom left region, a right region, a top right region, a bottom right region, a top region, a bottom region, or a core region.

Example 8 includes the apparatus of example 6, further including address translating circuitry to determine a target address of the data point in the second compute unit based on the width, the height, the depth, a border width, a border height, the location of the data point, and a compute unit offset.

Example 9 includes an apparatus comprising at least one memory, instructions, and at least one processor to execute the instructions to generate a sparsity map corresponding to a tensor, the sparsity map to indicate whether a data point of the tensor is zero, divide the tensor into one or more storage elements, perform a first compression of the one or more storage elements to generate one or more compressed storage elements, the first compression to remove zero points of the one or more storage elements based on the sparsity map, and perform a second compression of the one or more compressed storage elements, the second compression to store the one or more compressed storage elements contiguously in memory.

Example 10 includes the apparatus of example 9, wherein a size of the sparsity map is based on a data size of the data point of the tensor.

Example 11 includes the apparatus of example 9, wherein the at least one processor is to execute the instructions to generate a pointer table, the pointer table storing addresses corresponding to the one or more compressed storage elements of the second compression.

Example 12 includes the apparatus of example 9, wherein the at least one processor is to execute the instructions to rotate the tensor based on at least one of primary values of the tensor, secondary values of the tensor, a scaling factor, or a data alignment.

Example 13 includes the apparatus of example 9, wherein the at least one processor is to execute the instructions to broadcast a data point of a workload of the tensor of a first compute unit to at least a second compute unit, the workload having a width, a height, and a depth.

Example 14 includes the apparatus of example 13, wherein the at least one processor is to execute the instructions to determine a location of the data point in the workload.

Example 15 includes the apparatus of example 14, wherein the location is one of a left region, a top left region, a bottom left region, a right region, a top right region, a bottom right region, a top region, a bottom region, or a core region.

Example 16 includes the apparatus of example 14, wherein the at least one processor is to execute the instructions to determine a target address of the data point in the second compute unit based on the width, the height, the depth, a border width, a border height, the location of the data point, and a compute unit offset.

Example 17 includes at least one non-transitory computer readable medium comprising instructions that, when executed, cause at least one processor to at least generate a sparsity map corresponding to a tensor, the sparsity map to indicate whether a data point of the tensor is zero, divide the tensor into one or more storage elements, perform a first compression of the one or more storage elements to generate one or more compressed storage elements, the first compression to remove zero points of the one or more storage elements based on the sparsity map, and perform a second compression of the one or more compressed storage elements, the second compression to store the one or more compressed storage elements contiguously in memory.

Example 18 includes the at least one non-transitory computer readable medium of example 17, wherein a size of the sparsity map is based on a data size of the data point of the tensor.

Example 19 includes the at least one non-transitory computer readable medium of example 17, wherein the instructions, when executed, cause the at least one processor to generate a pointer table, the pointer table storing addresses corresponding to the one or more compressed storage elements of the second compression.

Example 20 includes the at least one non-transitory computer readable medium of example 17, wherein the instructions, when executed, cause the at least one processor to rotate the tensor based on at least one of primary values of the tensor, secondary values of the tensor, a scaling factor, or a data alignment.

Example 21 includes the at least one non-transitory computer readable medium of example 17, wherein the instructions, when executed, cause the at least one processor to broadcast a data point of a workload of the tensor of a first compute unit to at least a second compute unit, the workload having a width, a height, and a depth.

Example 22 includes the at least one non-transitory computer readable medium of example 21, wherein the instructions, when executed, cause the at least one processor to determine a location of the data point in the workload.

Example 23 includes the at least one non-transitory computer readable medium of example 22, wherein the location is one of a left region, a top left region, a bottom left region, a right region, a top right region, a bottom right region, a top region, a bottom region, or a core region.

Example 24 includes the at least one non-transitory computer readable medium of example 22, wherein the instructions, when executed, cause the at least one processor to determine a target address of the data point in the second compute unit based on the width, the height, the depth, a border width, a border height, the location of the data point, and a compute unit offset.

Example 25 includes a method comprising generating a sparsity map corresponding to a tensor, the sparsity map to indicate whether a data point of the tensor is zero, dividing the tensor into one or more storage elements, performing a first compression of the one or more storage elements to generate one or more compressed storage elements, the first compression to remove zero points of the one or more storage elements based on the sparsity map, and performing a second compression of the one or more compressed storage elements, the second compression to store the one or more compressed storage elements contiguously in memory.

Example 26 includes the method of example 25, wherein a size of the sparsity map is based on a data size of the data point of the tensor.

Example 27 includes the method of example 25, further including generating a pointer table, the pointer table storing addresses corresponding to the one or more compressed storage elements of the second compression.

Example 28 includes the method of example 25, further including rotating the tensor based on at least one of primary values of the tensor, secondary values of the tensor, a scaling factor, or a data alignment.

Example 29 includes the method of example 25, further including broadcasting a data point of a workload of the tensor of a first compute unit to at least a second compute unit, the workload having a width, a height, and a depth.

Example 30 includes the method of example 29, further including determining a location of the data point in the workload.

Example 31 includes the method of example 30, wherein the location is one of a left region, a top left region, a bottom left region, a right region, a top right region, a bottom right region, a top region, a bottom region, or a core region.

Example 32 includes the method of example 30, further including determining a target address of the data point in the second compute unit based on the width, the height, the depth, a border width, a border height, the location of the data point, and a compute unit offset.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   sparsity map generating circuitry to generate a sparsity map corresponding to a tensor, the sparsity map to indicate whether a data point of the tensor is zero;
   static storage controlling circuitry to:
      divide the tensor into one or more storage elements; and
      reallocate an amount of memory for the tensor based on one or more storage elements exceeding a threshold sparsity;
   rotation controlling circuitry to rotate the one or more storage elements to a target orientation based on a dimensionality of the tensor and a scaling factor including a number of bits in the data point;
   compressor circuitry to:
      perform a first compression of the one or more storage elements to generate one or more first compressed storage elements, the first compression to remove data points of the one or more storage elements based on the sparsity map; and
      perform a second compression of the one or more first compressed storage elements, the second compression to store the one or more first compressed storage elements contiguously in memory of a first compute unit; and
   post processing circuitry to:
      determine a data point of a workload of the one or more second compressed storage elements to transmit;
      determine a border region of the workload to transmit based on whether a data point of the workload is located within a border width and border height of the one or more second compressed storage elements; and
      replicate the border region to a memory of a second compute unit.

2. The apparatus of claim 1, wherein a size of the sparsity map is based on a data size of data points of the tensor, the data points including the data point.

3. The apparatus of claim 1, further including dynamic storage controlling circuitry to generate a pointer table, the pointer table storing addresses corresponding to the one or more compressed storage elements of the second compression.

4. The apparatus of claim 1, wherein the rotation controlling circuitry is to rotate the tensor based on at least one of secondary values of the tensor or a data alignment.

5. The apparatus of claim 1, further including data handling circuitry to broadcast the data point of the workload of the tensor of the first compute unit to at least the second compute unit, the workload having a width, a height, and a depth.

6. The apparatus of claim 5, further including memory location determining circuitry to determine a location of the data point in the workload.

7. The apparatus of claim 6, wherein the location is one of a left region, a top left region, a bottom left region, a right region, a top right region, a bottom right region, a top region, a bottom region, or a core region.

8. The apparatus of claim 6, further including address translating circuitry to determine a target address of the data point in the second compute unit based on the width, the height, the depth, a border width of the workload, a border height of the workload, the location of the data point, and a compute unit offset indicating a difference in location between the first compute unit and the second compute unit.

9. An apparatus comprising:
   at least one memory;
   instructions; and
   at least one processor to execute the instructions to:
      generate a sparsity map corresponding to a tensor, the sparsity map to indicate whether a data point of the tensor is zero;
      divide the tensor into one or more storage elements;
      reallocate an amount of memory for the tensor based on the one or more storage elements exceeding a threshold sparsity;
      perform a first compression of the one or more storage elements to generate one or more first compressed storage elements, the first compression to remove data points of the one or more storage elements based on the sparsity map;
      perform a second compression of the one or more first compressed storage elements, the second compression to store the one or more first compressed storage elements contiguously in memory of a first compute unit;
      rotate the one or more storage elements to a target orientation based on a dimensionality of the tensor and a scaling factor including a number of bits in the data point;
      determine a data point of a workload of the one or more second compressed storage elements to transmit;
      determine a border region of the workload to transmit based on whether a data point of the workload is located within a border width and border height of the one or more second compressed storage elements; and
      replicate the border region to a memory of a second compute unit.

10. The apparatus of claim 9, wherein a size of the sparsity map is based on a data size of data points of the tensor, the data points including the data point.

11. The apparatus of claim 9, wherein the at least one processor is to execute the instructions to generate a pointer table, the pointer table storing addresses corresponding to the one or more compressed storage elements of the second compression.

12. The apparatus of claim 9, wherein the at least one processor is to execute the instructions to rotate the tensor based on at least one of secondary values of the tensor or a data alignment.

13. The apparatus of claim 9, wherein the at least one processor is to execute the instructions to broadcast the data point of the workload of the tensor of the first compute unit to at least the second compute unit, the workload having a width, a height, and a depth.

14. The apparatus of claim 13, wherein the at least one processor is to execute the instructions to determine a location of the data point in the workload.

15. The apparatus of claim 14, wherein the location is one of a left region, a top left region, a bottom left region, a right region, a top right region, a bottom right region, a top region, a bottom region, or a core region.

16. The apparatus of claim 14, wherein the at least one processor is to execute the instructions to determine a target address of the data point in the second compute unit based on the width, the height, the depth, a border width of the workload, a border height of the workload, the location of the data point, and a compute unit offset indicating a difference in location between the first compute unit and the second compute unit.

17. At least one non-transitory computer readable medium comprising instructions that, when executed, cause at least one processor to at least:
generate a sparsity map corresponding to a tensor, the sparsity map to indicate whether a data point of the tensor is zero;
divide the tensor into one or more storage elements;
reallocate an amount of memory for the tensor based on the one or more storage elements exceeding a threshold sparsity;
perform a first compression of the one or more storage elements to generate one or more first compressed storage elements, the first compression to remove data points of the one or more storage elements based on the sparsity map;
perform a second compression of the one or more first compressed storage elements, the second compression to store the one or more first compressed storage elements contiguously in memory of a first compute unit;
rotate the one or more storage elements to a target orientation based on a dimensionality of the tensor and a scaling factor including a number of bits in the data point;
determine a data point of a workload of the one or more second compressed storage elements to transmit;
determine a border region of the workload to transmit based on whether a data point of the workload is located within a border width and border height of the one or more second compressed storage elements; and
replicate the border region to a memory of a second compute unit.

18. The at least one non-transitory computer readable medium of claim 17, wherein a size of the sparsity map is based on a data size of data points of the tensor, the data points including the data point.

19. The at least one non-transitory computer readable medium of claim 17, wherein the instructions, when executed, cause the at least one processor to generate a pointer table, the pointer table storing addresses corresponding to the one or more compressed storage elements of the second compression.

20. The at least one non-transitory computer readable medium of claim 17, wherein the instructions, when executed, cause the at least one processor to rotate the tensor based on at least one of secondary values of the tensor, or a data alignment.

21. The at least one non-transitory computer readable medium of claim 17, wherein the instructions, when executed, cause the at least one processor to broadcast the data point of the workload of the tensor of the first compute unit to at least the second compute unit, the workload having a width, a height, and a depth.

22. The at least one non-transitory computer readable medium of claim 21, wherein the instructions, when executed, cause the at least one processor to determine a location of the data point in the workload.

23. The at least one non-transitory computer readable medium of claim 22, wherein the location is one of a left region, a top left region, a bottom left region, a right region, a top right region, a bottom right region, a top region, a bottom region, or a core region.

24. The at least one non-transitory computer readable medium of claim 22, wherein the instructions, when executed, cause the at least one processor to determine a target address of the data point in the second compute unit based on the width, the height, the depth, a border width of the workload, a border height of the workload, the location of the data point, and a compute unit offset indicating a difference in location between the first compute unit and the second compute unit.

* * * * *